United States Patent
Fountain, Jr. et al.

(10) Patent No.: US 12,381,173 B2
(45) Date of Patent: Aug. 5, 2025

(54) DIRECT HYBRID BONDING OF SUBSTRATES HAVING MICROELECTRONIC COMPONENTS WITH DIFFERENT PROFILES AND/OR PITCHES AT THE BONDING INTERFACE

(71) Applicant: ADEIA SEMICONDUCTOR BONDING TECHNOLOGIES INC., San Jose, CA (US)

(72) Inventors: Gaius Gillman Fountain, Jr., Youngsville, NC (US); Chandrasekhar Mandalapu, Morrisville, NC (US); Cyprian Emeka Uzoh, San Jose, CA (US); Jeremy Alfred Theil, Mountain View, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 18/067,617

(22) Filed: Dec. 16, 2022

(65) Prior Publication Data

US 2023/0268308 A1 Aug. 24, 2023

Related U.S. Application Data

(63) Continuation of application No. 17/096,846, filed on Nov. 12, 2020, now Pat. No. 11,552,041, which is a
(Continued)

(51) Int. Cl.
*H01L 23/00* (2006.01)

(52) U.S. Cl.
CPC .............. *H01L 24/27* (2013.01); *H01L 24/03* (2013.01); *H01L 24/05* (2013.01); *H01L 24/06* (2013.01);
(Continued)

(58) Field of Classification Search
CPC ......... H01L 24/27; H01L 24/03; H01L 24/05; H01L 24/06; H01L 24/29; H01L 24/30;
(Continued)

(56) References Cited

U.S. PATENT DOCUMENTS

| 4,612,083 A | 9/1986 | Yasumoto et al. |
| 4,818,728 A | 4/1989 | Rai et al. |

(Continued)

FOREIGN PATENT DOCUMENTS

| CN | 105140144 A | 12/2015 |
| CN | 106653720 A | 5/2017 |

(Continued)

OTHER PUBLICATIONS

Amirfeiz et al., "Formation of silicon structures by plasma-activated wafer bonding," Journal of the Electrochemical Society, 2000, vol. 147, No. 7, pp. 2693-2698.
(Continued)

*Primary Examiner* — Britt D Hanley
*Assistant Examiner* — Vicki B. Booker
(74) *Attorney, Agent, or Firm* — Knobbe, Martens, Olson & Bear, LLP

(57) ABSTRACT

Representative implementations of techniques and methods include chemical mechanical polishing for hybrid bonding. The disclosed methods include depositing and patterning a dielectric layer on a substrate to form openings in the dielectric layer, depositing a barrier layer over the dielectric layer and within a first portion of the openings, and depositing a conductive structure over the barrier layer and within a second portion of the openings not occupied by the barrier layer, at least a portion of the conductive structure in the second portion of the openings coupled or contacting electrical circuitry within the substrate. Additionally, the conductive structure is polished to reveal portions of the barrier
(Continued)

layer deposited over the dielectric layer and not in the second portion of the openings. Further, the barrier layer is polished with a selective polish to reveal a bonding surface on or at the dielectric layer.

26 Claims, 11 Drawing Sheets

Related U.S. Application Data continuation of application No. 16/133,299, filed on Sep. 17, 2018, now Pat. No. 10,840,205.

(60) Provisional application No. 62/730,936, filed on Sep. 13, 2018, provisional application No. 62/562,449, filed on Sep. 24, 2017.

(52) U.S. Cl.
CPC .............. *H01L 24/29* (2013.01); *H01L 24/30* (2013.01); *H01L 24/32* (2013.01); *H01L 24/83* (2013.01); H01L 24/80 (2013.01); H01L 2224/03462 (2013.01); H01L 2224/03616 (2013.01); H01L 2224/05155 (2013.01); H01L 2224/05166 (2013.01); H01L 2224/05181 (2013.01); H01L 2224/05547 (2013.01); H01L 2224/05647 (2013.01); H01L 2224/0603 (2013.01); H01L 2224/06131 (2013.01); H01L 2224/06136 (2013.01); H01L 2224/06152 (2013.01); H01L 2224/06155 (2013.01); H01L 2224/08145 (2013.01); H01L 2224/27462 (2013.01); H01L 2224/27616 (2013.01); H01L 2224/29147 (2013.01); H01L 2224/29155 (2013.01); H01L 2224/29186 (2013.01); H01L 2224/3003 (2013.01); H01L 2224/30131 (2013.01); H01L 2224/3015 (2013.01); H01L 2224/30505 (2013.01); H01L 2224/30517 (2013.01); H01L 2224/32145 (2013.01); H01L 2224/80035 (2013.01); H01L 2224/80357 (2013.01); H01L 2224/80895 (2013.01); H01L 2224/80896 (2013.01); H01L 2224/80935 (2013.01); H01L 2224/80948 (2013.01); H01L 2224/80986 (2013.01); H01L 2224/83895 (2013.01); H01L 2224/83896 (2013.01); H01L 2224/83905 (2013.01)

(58) Field of Classification Search
CPC ......... H01L 24/32; H01L 24/83; H01L 24/80; H01L 21/3212; H01L 21/7684; H01L 2224/03462; H01L 2224/03616; H01L 2224/05155; H01L 2224/05166; H01L 2224/05181; H01L 2224/05547; 2224/05647; H01L 2224/0603; H01L 2224/06131; H01L 2224/06136; H01L 2224/06152; H01L 2224/06155; H01L 2224/08145; H01L 2224/27462; H01L 2224/27616; H01L 2224/29147; H01L 2224/29155; H01L 2224/29186; 2224/3003; H01L 2224/30131; H01L 2224/3015; H01L 2224/30505; H01L 2224/30517; H01L 2224/32145; H01L 2224/80035; H01L 2224/80357; H01L 2224/80895; H01L 2224/80896; H01L 2224/80935; H01L 2224/80948; H01L 2224/80986; H01L 2224/83895; H01L 2224/83896; H01L 2224/83905; H01L 2224/05557; H01L 2224/8034; H01L 2224/80345; H01L 2224/83986; H01L 2924/14

See application file for complete search history.

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,418,687 A | 5/1995 | Chen |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,034,393 A | 3/2000 | Sakamoto et al. |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,355,153 B1 | 3/2002 | Uzoh et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,541,382 B1 | 4/2003 | Cheng et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |

(56) References Cited

U.S. PATENT DOCUMENTS

| | | |
|---|---|---|
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,387,944 B2 | 6/2008 | Tong et al. |
| 7,485,968 B2 | 2/2009 | Enquist et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,507,979 B1 | 8/2013 | Huang et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,742,576 B2 | 6/2014 | Thacker et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,040,385 B2 | 5/2015 | Chen et al. |
| 9,064,937 B2 | 6/2015 | Edelstein et al. |
| 9,082,627 B2 | 7/2015 | Tong et al. |
| 9,082,644 B2 | 7/2015 | Ossimitz et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,032 B2 | 5/2016 | Liu et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,343,369 B2 | 5/2016 | Du et al. |
| 9,368,866 B2 | 6/2016 | Yu |
| 9,385,024 B2 | 7/2016 | Tong et al. |
| 9,394,161 B2 | 7/2016 | Cheng et al. |
| 9,425,155 B2 | 8/2016 | Liu et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,472,529 B2 | 10/2016 | Vora |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,666,559 B2 | 5/2017 | Wang et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,859,254 B1 | 1/2018 | Yu et al. |
| 9,865,581 B2 | 1/2018 | Jang et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,129 B2 | 5/2018 | Liu et al. |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,090,351 B2 | 10/2018 | Ashidate et al. |
| 10,103,122 B2 | 10/2018 | Liu et al. |
| 10,147,641 B2 | 12/2018 | Enquist et al. |
| 10,204,893 B2 | 2/2019 | Uzoh et al. |
| 10,211,166 B2 | 2/2019 | Matsuo |
| 10,269,708 B2 | 4/2019 | Enquist et al. |
| 10,269,756 B2 | 4/2019 | Uzoh |
| 10,269,778 B2 | 4/2019 | Lin et al. |
| 10,276,619 B2 | 4/2019 | Kao et al. |
| 10,276,909 B2 | 4/2019 | Huang et al. |
| 10,312,275 B2 | 6/2019 | Hynecek |
| 10,418,277 B2 | 9/2019 | Cheng et al. |
| 10,431,614 B2 | 10/2019 | Gambino et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,672,654 B2 | 6/2020 | Uzoh et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,796,913 B2 | 10/2020 | Lin |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |

(56) References Cited

U.S. PATENT DOCUMENTS

| | | |
|---|---|---|
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,462,419 B2 | 10/2022 | Haba |
| 11,476,213 B2 | 10/2022 | Haba et al. |
| 11,515,291 B2 | 11/2022 | DeLaCruz et al. |
| 11,552,041 B2 | 1/2023 | Fountain, Jr. et al. |
| 11,626,363 B2 | 4/2023 | Haba et al. |
| 11,631,647 B2 | 4/2023 | Haba |
| 11,929,347 B2 | 3/2024 | DeLaCruz et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2002/0113241 A1 | 8/2002 | Kubota et al. |
| 2003/0092220 A1 | 5/2003 | Akram |
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2004/0072423 A1 | 4/2004 | Jorne et al. |
| 2004/0084414 A1 | 5/2004 | Sakai et al. |
| 2004/0126990 A1 | 7/2004 | Ohta |
| 2004/0157407 A1 | 8/2004 | Tong et al. |
| 2004/0217483 A1 | 11/2004 | Hedler et al. |
| 2004/0262772 A1 | 12/2004 | Ramanathan et al. |
| 2005/0104224 A1 | 5/2005 | Huang et al. |
| 2005/0181542 A1 | 8/2005 | Enquist |
| 2006/0024950 A1 | 2/2006 | Choi et al. |
| 2006/0057945 A1 | 3/2006 | Hsu et al. |
| 2006/0138368 A1 | 6/2006 | Lee |
| 2007/0096294 A1 | 5/2007 | Ikeda et al. |
| 2007/0111386 A1 | 5/2007 | Kim et al. |
| 2007/0212870 A1 | 9/2007 | Yang et al. |
| 2007/0222048 A1 | 9/2007 | Huang |
| 2007/0257366 A1 | 11/2007 | Wang et al. |
| 2007/0295456 A1 | 12/2007 | Gudeman et al. |
| 2008/0122092 A1 | 5/2008 | Hong |
| 2009/0108469 A1 | 4/2009 | Kang et al. |
| 2009/0197408 A1 | 8/2009 | Lehr et al. |
| 2009/0200668 A1 | 8/2009 | Yang et al. |
| 2010/0148362 A1 | 6/2010 | Sakurai |
| 2010/0164066 A1 | 7/2010 | Di Franco |
| 2011/0074040 A1 | 3/2011 | Frank et al. |
| 2011/0290552 A1 | 12/2011 | Palmateer et al. |
| 2012/0211894 A1 | 8/2012 | Aoyagi |
| 2012/0212384 A1 | 8/2012 | Kam et al. |
| 2012/0319280 A1 | 12/2012 | Suganuma et al. |
| 2013/0020704 A1 | 1/2013 | Sadaka |
| 2013/0034948 A1 | 2/2013 | Huang et al. |
| 2013/0075900 A1 | 3/2013 | Shim et al. |
| 2013/0078783 A1 | 3/2013 | Nieh et al. |
| 2013/0187287 A1 | 7/2013 | Park et al. |
| 2013/0221527 A1 | 8/2013 | Yang et al. |
| 2013/0256913 A1 | 10/2013 | Black et al. |
| 2013/0284885 A1 | 10/2013 | Chen et al. |
| 2013/0320556 A1 | 12/2013 | Liu et al. |
| 2013/0328186 A1 | 12/2013 | Uzoh et al. |
| 2014/0131869 A1 | 5/2014 | Pendse |
| 2014/0145338 A1 | 5/2014 | Fujii et al. |
| 2014/0175655 A1 | 6/2014 | Chen et al. |
| 2014/0206109 A1 | 7/2014 | Ossimitz et al. |
| 2014/0217593 A1 | 8/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0064498 A1 | 3/2015 | Tong |
| 2015/0096798 A1 | 4/2015 | Uzoh |
| 2015/0097022 A1 | 4/2015 | Di Cioccio et al. |
| 2015/0108644 A1 | 4/2015 | Kuang et al. |
| 2015/0155263 A1 | 6/2015 | Farooq et al. |
| 2015/0200073 A1 | 7/2015 | Jen et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2015/0255417 A1 | 9/2015 | Farooq et al. |
| 2015/0307819 A1 | 10/2015 | Ida et al. |
| 2015/0340269 A1 | 11/2015 | Rivoire et al. |
| 2015/0340371 A1 | 11/2015 | Lue |
| 2015/0364434 A1 | 12/2015 | Chen et al. |
| 2016/0027761 A1 | 1/2016 | Co et al. |
| 2016/0086923 A1 | 3/2016 | Best |
| 2016/0148816 A1 | 5/2016 | Lee et al. |
| 2016/0181228 A1 | 6/2016 | Higuchi et al. |
| 2016/0190103 A1 | 6/2016 | Tatsuya et al. |
| 2016/0322414 A1 | 11/2016 | Chen et al. |
| 2016/0343682 A1 | 11/2016 | Kawasaki |
| 2017/0053897 A1 | 2/2017 | Lai et al. |
| 2017/0062366 A1 | 3/2017 | Enquist |
| 2017/0179029 A1 | 6/2017 | Enquist et al. |
| 2017/0194271 A1 | 7/2017 | Hsu et al. |
| 2017/0250160 A1 | 8/2017 | Wu et al. |
| 2017/0278698 A1 | 9/2017 | Ikegawa et al. |
| 2017/0358551 A1 | 12/2017 | Liu et al. |
| 2017/0365487 A1 | 12/2017 | Shen et al. |
| 2018/0130784 A1 | 5/2018 | Pagani |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0219038 A1 | 8/2018 | Gambino et al. |
| 2018/0226371 A1 | 8/2018 | Enquist |
| 2018/0226375 A1 | 8/2018 | Enquist et al. |
| 2018/0240860 A1* | 8/2018 | Yang ............... H01L 23/53257 |
| 2018/0269325 A1 | 9/2018 | Cheng et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337129 A1 | 11/2018 | Li et al. |
| 2018/0350674 A1 | 12/2018 | Uzoh |
| 2019/0057756 A1 | 2/2019 | Kim et al. |
| 2019/0088535 A1 | 3/2019 | Yan et al. |
| 2019/0096741 A1 | 3/2019 | Uzoh et al. |
| 2019/0096842 A1 | 3/2019 | Fountain, Jr. et al. |
| 2019/0109042 A1* | 4/2019 | Katkar ............... H01L 25/0657 |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0189603 A1* | 6/2019 | Wang ................... H01L 23/481 |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |

(56) References Cited

U.S. PATENT DOCUMENTS

| | | |
|---|---|---|
| 2020/0013765 A1 | 1/2020 | Fountain, Jr. et al. |
| 2020/0035630 A1 | 1/2020 | Kameshima |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0066233 A1 | 3/2021 | Fountain, Jr. et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0005784 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0216180 A1 | 7/2022 | DeLaCruz et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0118156 A1 | 4/2023 | Gao et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0379607 A1 | 11/2024 | Fountain, Jr. et al. |

FOREIGN PATENT DOCUMENTS

| | | |
|---|---|---|
| CN | 106920795 A | 7/2017 |
| CN | 107039380 A | 8/2017 |
| CN | 107731668 A | 2/2018 |
| CN | 107993927 A | 5/2018 |
| CN | 107993928 A | 5/2018 |
| CN | 109155301 A | 1/2019 |
| CN | 109417073 A | 3/2019 |
| CN | 109417075 A | 3/2019 |
| CN | 109417077 A | 3/2019 |
| CN | 109643643 A | 4/2019 |
| CN | 109844915 A | 6/2019 |
| EP | 0 465 227 A2 | 1/1992 |
| EP | 2 863 420 A1 | 4/2015 |
| JP | 61-030059 | 2/1986 |
| JP | 01-168040 | 7/1989 |
| JP | 4-259249 | 9/1992 |
| JP | 05-029183 | 2/1993 |
| JP | 5-198739 | 8/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |

(56) References Cited

FOREIGN PATENT DOCUMENTS

| | | |
|---|---|---|
| JP | 2003-023071 | 1/2003 |
| JP | 2004-200547 | 7/2004 |
| JP | 2005-086089 | 3/2005 |
| JP | 2005-093486 | 4/2005 |
| JP | 2005-135988 | 5/2005 |
| JP | 2013-033786 A | 2/2013 |
| JP | 2013-033900 A | 2/2013 |
| JP | 2013-243333 | 12/2013 |
| JP | 2018-160519 | 10/2018 |
| JP | 2019-129199 | 8/2019 |
| KR | 10-2012-0106366 | 9/2012 |
| KR | 10-2015-0097798 | 8/2015 |
| KR | 2017-0109865 A | 10/2017 |
| TW | 476145 | 2/2002 |
| WO | WO 01/61743 A1 | 8/2001 |
| WO | WO 03/054954 A2 | 7/2003 |
| WO | WO 2005/043584 A2 | 5/2005 |
| WO | WO 2006/100444 A1 | 9/2006 |
| WO | WO 2012/013162 A1 | 2/2012 |
| WO | WO 2016/185883 A1 | 11/2016 |
| WO | WO 2017/151442 A1 | 9/2017 |
| WO | WO 2017/155002 A1 | 9/2017 |
| WO | WO 2019/146427 A1 | 8/2019 |

OTHER PUBLICATIONS

Appeal Decision of Rejection issued on Apr. 12, 2016 in Japanese Patent Application No. 2008-526104, in 14 pages.
Aspar, B. et al., "The smart-cut process: Status and developments," Proc. Electrochem Soc., 1999, vol. 99-53, pp. 48-59.
Bower, R. et al., "Low temperature Si3N4 direct bonding," Appl. Phys. Lett., Jun. 28, 1993, vol. 62, No. 26, pp. 3485-3487.
Canadian Office Action issued Aug. 1, 2013 in Canadian Patent Application No. 2,618,191, 4 pages.
Canadian Office Action, mailed May 16, 2012 for Canadian Patent Application No. 2,515,375, with international preliminary report, 2 pages.
Ceramic Microstructures: Control at the Atomic Level, Recent Progress in Surface Activated Bonding, 1998, pp. 385-389.
"Chemical Mechanical Polishing (CMP) Metrology with Advanced Surface Polisher," Park Systems, 4 pages.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
D'Agostino, R., "Plasma etching of Si and SiO2 in SF6—O2 mixtures," J. Appl. Phys., Jan. 1981, vol. 52, No. 1, pp. 162-167.
Decision—Request for Trail Granted, Inter Partes Review, U.S. Pat. No. 7,485,968, Case IPR2013-00381, dated Dec. 18, 2013, in 27 pages.
Declaration of Richard A. Blanchard in Support of Petition for inter partes review of U.S. Pat. No. 7,485,968, dated Jun. 13, 2013, pp. 1-18.
Derbyshire, Katherine, "The darker side of hybrid bonding," Semiconductor Engineering, Dec. 17, 2020, https://semiengineering.com/author/katherine/, 6 pages.
Dysard, Jeffrey M. et al., "CMP solutions for the integration of high-k metal gate technologies," ECS Transactions, 2010, vol. 33, Issue 10, pp. 77-89.
Extended European Search Report dated Jun. 9, 2021, European Application No. 18858434.6, 10 pages.
Fan et al., "Copper wafer bonding," Electrochem. Solid-State Lett., U.S.A., The Electrochemical Society, Aug. 6, 1999, vol. 2, No. 10, pp. 534-536.

Fang, S.J. et al., "Advanced process control in dielectric chemical mechanical polishing (CMP)," Texas Instruments, Silicon Technology Development, 8 pages.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Final Written Decision, Inter PartesReview, U.S. Pat. No. 7,485,968, Case IPR2013-00381, dated Feb. 27, 2014, in 3 pages.
Gao, Guilian et al., "Scaling package interconnects below 20 m pitch with hybrid bonding," 2018 IEEE 68th Electronic Components and Technology Conference (ECTC), IEEE, May 29, 2018, pp. 314-322, XP033380016.
Gösele et al., "Semiconductor Wafer Bonding: A flexible approach to materials combinations in microelectronics; micromechanics and optoelectronics," IEEE, 1997, pp. 23-32.
Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.
Handbook of Thin Film Technology, Maissel and Glang, 1983 Reissue, pp. 12-24.
Harendt, C. et al., "Vertical polysilicon interconnects by aligned wafer bonding," Electrochemical Society Proceedings, 1998, vol. 97-36, pp. 501-508.
Hayashi, Y. et al., "Fabrication of three-dimensional IC using cumulatively bonded IC (CUBIC) technology," VSLI Tech. Dog., 1990, pp. 95-96.
Hizukuri, M. et al., "Dynamic strain and chip damage during ultrasonic flip chip bonding," Jpn. J. Appl. Phys. 40, 2001, pp. 3044-3048.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p. Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
"Hybrid Bonding—Patent Landscape Analysis," from Technologies to IP Business Intelligence, KnowMade Patent & Technology Intelligence, www.kmowmade.com, Nov. 2019, 81 pages.
Hymes, S. et al., "Determination of the planarization distance for copper CMP process," 6 pages.
Iida, A. et al., "The study of initial mechanism for Al—Au solid phase diffusion flip-chip bonding," Jpn. J. Appl. Phys. 40, 1997, pp. 3044-3661.
International Search Report and Written Opinion mailed Apr. 22, 2019 in International Application No. PCT/US2018/064982, 13 pages.
International Search Report and Written Opinion mailed Mar. 7, 2019, in International Application No. PCT/US2018/060044, 14 pages.
International Search Report and Written Opinion, dated Jan. 10, 2019, for PCT Application No. PCT/US2018/051537, 3 pages.

(56) References Cited

OTHER PUBLICATIONS

International Search Report and Written Opinion mailed Oct. 8, 2019, in International Application No. PCT/US2019/037072, 13 pages.
International Search Report and Written Opinion mailed Dec. 6, 2019, in International Application No. PCT/US2019/047513, 12 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kissinger, G. et al., "Void-free silicon-wafer-bond stregthening in the 200-400 C range," Sensors and Actuators A, 1993, vol. 36, pp. 149-156.
Krauter, G. et al., "Low temperature silicon direct bonding for application in micromechanics: bonding energies for different combinations of oxides," Sensors and Actuators A, 1998, vol. 70, pp. 271-275.
Kunio, Takemitsu, "Three dimensional IC technology, using cubic method," Journal of the JWS, Japan Welding Society, Apr. 5, 1994, vol. 63, No. 3, pp. 185-189.
Lee, D. et al., "Slurry components in metal chemical mechanical planarization (CMP) process: A review," International Journal of Precision Engineering and Manufacturing, Dec. 2016, vol. 17, No. 12, pp. 1751-1762.
Li, Yuzhuo "Key factors that influence step height reduction efficiency and defectivity during metal CMP," Clarkson University, Levitronix CMP Users' Conference 2006, 2006, 32 pages.
Li, Y.A. et al., "Low temperature copper to copper direct bonding," Jpn. Appl. Phys. 37, 1998, pp. L1068-L1069.
Li, Y.A. et al., "Systematic low temperature silicon bonding using pressure and temperature," Jpn. J. Appl. Phys., vol. 37, 1998, pp. 737-741.
Liu, Zi-Yu et al. "Detection and formation mechanism of microdefects in ultrafine pitch Cu—Cu direct bonding," Chin. Phys. B, 2016, vol. 25, No. 1, pp. 018103-1-018103-7.
Liu, C. et al., "Low-temperature direct copper-to-copper bonding enabled by creep on (111) surfaces of nanotwinned Cu," Scientific Reports, May 12, 2015, 5:09734, pp. 1-11.
Lu, L. et al., "Grain growth and strain release in nanocrystalline copper," Journal of Applied Physics, vol. 89, Issue 11, pp. 6408.
Luo, Ying, "Slurry Chemistry Effects on Copper Chemical Mechanical Planarization," University of Central Florida Stars, Electronic Theses and Dissertations, 2004, Paper 36, 111 pages.
Matsuzawa et al., "Room-temperature interconnection of electroplated Au microbump by means of surface activated bonding method," Electornic Components and Technology Conferenece, 2001, 51st Proceedings, IEEE, pp. 384-387.
Monsma et al., "Development of the spin-valve transistor," IEEE Tran. Magnet., vol. 33, No. 5, Sep. 1997, pp. 3495-3499.
Moriceau, H. et al., "Overview of recent direct wafer bonding advances and applications," Advances in Natural Sciences—Nanoscience and Nanotechnology, 2010, 11 pages.
Mott, D. et al., "Synthesis of size-controlled and shaped copper nanoparticles, " Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Ortleb, Thomas et al., "Controlling macro and micro surface topography for a 45nm copper CMP process using a high resolution profiler," Proc. of SPIE, 2008, vol. 6922, 11 pages.
Paul, E. et al., "A model of copper CMP," J. Electrochem. Soc., 2005, vol. 152, Issue 4, pp. G322-G328.
Petition for Inter Partes Review of U.S. Pat. No. 7,485,968, IPR 2013-00381, filed Jun. 21, 2013, pp. 1-49.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Rhoades, Robert L., "The Dark Art of CMP," Future Fab International, Issue 24, 10 pages.
Roberds et al., "Low temperature , in situ, plasma activated wafer bonding," Electrochecmical Society Proceedings, 1997, vol. 97-36, pp. 598-606.
Rosales-Yeomans, D. et al., "Evaluation of pad groove designs under reduced slurry flow rate conditions during copper CMP," Journal of the Electrochemical Society, 2008, vol. 155, No. 10, pp. H812-H818.
Samsung Galaxy S7 Edge Teardown, posted Apr. 24, 2016, contributing authors: Jim Morrison, Ray Fontaine, Dick James and Daniel Yang, https://www.techinsights.com/blog/samsung-galaxy-s7-edge-teardown, last accessed on May 16, 2022, 6 pages.
Sart C., et al., "Cu/SiO2 hybrid bonding; Finite element modeling and experimental characterization," 2016 6th Electronic System-Integration Technology Conference (ESTC), IEEE, Sep. 13, 2016, pp. 1-7, XP033015798.
Schmidt, Martin A., Wafer-To-Wafer Bonding for Microstructure Formation, Proceedings of the IEEE, vol. 86, No. 8, 1998, pp. 1575-1586.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shimatsu, T. et al., "Metal bonding during sputter film deposition," J. Vac. Sci. Technol. A 16(4), 1998, pp. 2125-2131.
Shingo et al., "Design and fabrication of an electrostatically actuated MEMS probe card," Transducers, Solid-State Sensors, Actuators and Microsystems, 12th International Conference, Jun. 8-12, 2003, vol. 2, pp. 1522-1525.

(56) References Cited

OTHER PUBLICATIONS

Steinkirchner, J. et al., "Silicon wafer bonding via designed monolayers," Advanced Materials, 1995, vol. 7, No. 7, 7 pages.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tong, Q.Y. et al., "Semiconductor wafer bonding," Materials Chemistry and Physics, R25, 1999, 239 pages (exerpts).
Tong, Q.Y. et al., "Semiconductor wafer bonding: recent developments," Materials Chemistry and Physics, vol. 37, 1994, pp. 101-127.
Tong, Q.Y. et al., "Semiconductor wafer bonding: science and technology," 1999, 120 pages.
Tong, Q.Y. et al., "Semiconductor wafer bonding: science and technology," 1999, 159 pages.
Tong, Q.Y. et al., "Wafer bonding and layer splitting for microsystems," Advanced Materials, 1999, vol. 11, No. 17, pp. 1409-1425.
Topol et al., "Enabling technologies for wafer-level bonding of 3D MEMS and integrated circuit structures," 2004 Electronics Components and Technology Conference, 2004 IEEE, pp. 931-938.
Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold—gold thermocompression bonds," Mater. Soc. Symp. Proc. 605, 1999, pp. 171-176.
Vossen, J. et al., "Thin Film Processes II," Academic Press, 1991, 62 pages.
Vossen, J. et al., "Thin Film Processes," Academic Press, 1978, 62 pages.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump-Cu direct interconnections fabricated by means of surface activated bonding method," Microelectronics Reliability, May 2003, vol. 43, Issue 5, pp. 751-756.
Warner, K. et al., "Low-temperature oxide-bonded three-dimensional integrated circuits," IEEE International SOI Conference, Oct. 2012, pp. 123-125.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Wikipedia, "Chemical bond," URL http://en.wikipedia.org/wiki/chemical_bond, accessed on Mar. 31, 2010, 10 pages.
Wikipedia, "Van der Waals force," URL https://en.wikipedia.org/wiki/Van_der_Waals_force, originally accessed on Mar. 31, 2010, 7 pages.
Xu et al., "New Au—Al interconnect technology and its reliability by surface activated bonding," Electronic Packaging Technology Proceedings, Oct. 28-30, 2003, Shanghai, China, pp. 479-483.
Yablonovitch, E. et al., "Van der Waals bonding of GaAs on Pd leads to a permanent, solid-phase-topotaxial metallurgical bond," Appl. Phys. Lett. 59, 1991, pp. 3159-3161.
Image showing a partial cross-section of Sony IMX260 BSI image sensor from Samsung Galaxy S7; product believed to be released Mar. 2016.
Image showing a partial cross-section of Omnivision OV16B10 16MP BSI image sensor from Huawei P20 Lite Phone; product believed to be released May 2018.
Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
OMSEMI AR0820 image, cross section of a CMOS image sensor product. The part in the image was shipped on Sep. 16, 2021. Applicant makes no representation that the part in the image is

(56) References Cited

OTHER PUBLICATIONS identical to the part identified in the separately submitted reference BUSH, Nov. 8, 2018, Electronics Weekly.com ("BUSH article"); however, the imaged part and the part shown in the BUSH article share the part No. "ONSEMI AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

"Chip to Wafer Hybrid Bonding Development for High Volume Manufacturing," 19th International Conference & Exhibition on Device Packaging, Fountain Hills, AZ, Mar. 13-16, 2023, Applied Materials and Besi, 23 pages.

Kagawa, Y, et al., "An Advanced CuCu Hybrid Bonding for Novel Stacked CMOS Image Sensor," 2018 IEEE 2nd Electron Devices Technology and Manufacturing Conference (EDTM), Mar. 13-16, 2018, IEEE, Jul. 30, 2018, 3 pages.

Michailos, Jean, "Future landscape for 3D Integration: from Interposers to 3D High Density," 3d ASIP—Dec. 13-15, 2016, San Francisco Airport, USA, 46 pages.

\* cited by examiner

DIRECT HYBRID BONDING OF SUBSTRATES HAVING MICROELECTRONIC COMPONENTS WITH DIFFERENT PROFILES AND/OR PITCHES AT THE BONDING INTERFACE

PRIORITY CLAIM AND CROSS-REFERENCE TO RELATED APPLICATION

This application is a continuation of U.S. patent application Ser. No. 16/133,299 (U.S. Pat. No. 10,840,205), filed Sep. 17, 2018, entitled "CHEMICAL MECHANICAL POLISHING FOR HYBRID BONDING," which claims the benefit under 35 U.S.C. § 119(e)(1) of U.S. Provisional Application No. 62/730,936, filed Sep. 13, 2018, and U.S. Provisional Application No. 62/562,449, filed Sep. 24, 2017, entitled "CHEMICAL MECHANICAL POLISHING FOR HYBRID BONDING," disclosures of which are hereby incorporated by reference in their entirety.

FIELD

The following description relates to polishing of integrated circuits ("ICs"). More particularly, the following description relates to mechanical polishing for hybrid bonding of ICs.

BACKGROUND

Hybrid bonding is a useful technique for bonding microelectric components such as dies and wafers and forming electrical connections. One hybrid bonding technique is "Direct Bond Interconnect (DBI®)" available from Invensas Bonding Technologies, Inc. (formerly known as Ziptronix, Inc.), a subsidiary of Xperi Corp. (see for example, U.S. Pat. No. 7,485,968, which is incorporated herein in its entirety). Generally, two dielectrics (located each on a separate substrate) are brought together to form a bond at low or ambient temperatures, without an intervening material such as an adhesive.

As part of, or subsequent to, this bonding process, a conductive structure (such as copper pads, posts, through substrate vias, or bumps) may be interspersed within the dielectric layers of the IC. Conductive features on each substrate may be aligned to provide an electrical interface between the two substrates.

Conventional techniques for forming a bonding surface for forming a hybrid bond may include forming an insulating layer (e.g. an oxide) on a substrate (e.g. an active semiconductor die, or the like). The insulating layer may be patterned to form openings and a barrier layer may be formed over the insulating layer and within the patterned openings. Additionally, a conductive structure (e.g. Cu, etc.) may be formed in the openings and often over the insulating layer as well. A portion of the conductive structure may then be removed by a chemical-mechanical planarization (CMP) process, and the barrier layer overlying the insulating layer may be further removed by the CMP process. In this manner, the remaining conductive structure and the surface of the insulating layer may be prepped such that the conductive structure may form an electrical connection with the conductive structure of the other substrate, and the insulating layer may form a hybrid (i.e. mechanical) bond with an insulating layer of the other substrate.

However, when using such conventional techniques, oxide rounding, and conductive structure dishing may occur. Oxide rounding may lead to gaps in the oxide bonding between copper elements of each substrate. Additionally, conductive structure dishing may cause failed copper bonding. A cause of such defects may be due to such materials being worn unevenly during the CMP process, thus affecting the quality of the bond surface. As such, there is a need to improve the planarization of the surface and the conductive structure dishing, which in turn, would improve the yield and reliability of the hybrid bonding technique.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

SUMMARY

Figure 1:
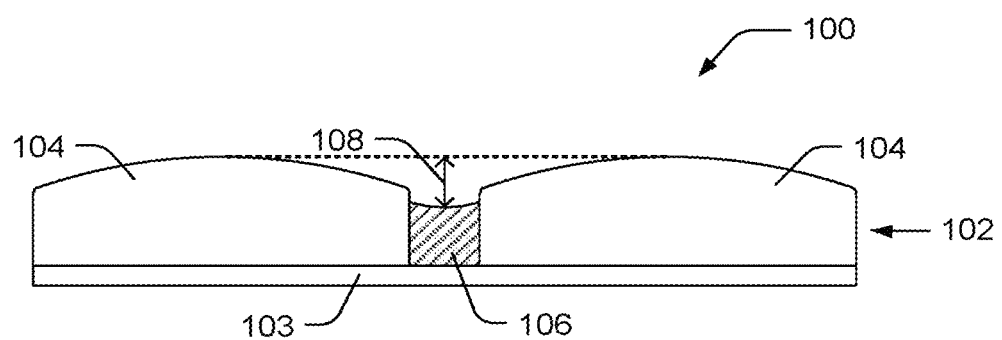
FIG. 1 shows a profile view of oxide rounding and conductive structure dishing.

Various embodiments and techniques are disclosed for chemical mechanical polishing for hybrid bonding. The embodiments comprise techniques to prevent or remove the presence of dielectric erosion (or rounding) and conductive structure dishing found on dies, resulting in a more uniform and consistent planar bonding surface.

A method can include depositing and patterning a dielectric layer on a substrate to form openings in the dielectric layer, depositing a barrier layer over the dielectric layer and within a portion of the openings, and depositing a conductive structure over the barrier layer and within at least a portion of the openings, at least a portion of the conductive structure coupled or contacting electrical circuitry within the substrate. Additionally, the conductive structure may be polished to reveal portions of the barrier layer deposited over the dielectric layer and not in the openings such that the conductive structure does not recess more than a first predetermined amount below a plane defined by the portions of the barrier layer deposited over the dielectric layer and not in the openings. Further, the barrier layer may be polished with a selective polish to reveal a bonding surface on or at the dielectric layer, such that the surface of the dielectric layer adjacent to the conductive structure is not rounded more than a second predetermined amount. Additionally, after preparing a bonding surface of the conductive structure, the conductive structure may be recessed not more than a third predetermined amount. In the event that multiple conductive structures are provided they may be of the same or different sizes and may be arranged in one or more regular patterns, each arrangement which may have the same or similar sized structures and/or the same or different pitches between adjacent structures. For example, the conductive structures may be larger than 5 microns each and arranged in a pattern with a pitch of 1.2 or larger.

In a first embodiment, at least a portion of the conductive structure in the second portion of the openings is coupled to or contacts electrical circuitry within the substrate. Additionally, the method may include bonding the bonding surface of the substrate with a bonding surface of another substrate. For example, an electrical connection may be formed between conductive portions of the substrate and the other substrate after bonding by annealing the bonded structure at a temperature under 400 degrees C. Additionally, the bonding surface of the substrate and the bonding surface of the other substrate may be bonded using a direct bonding technique without adhesive. Further, the bonding surface and the conductive structure may have a surface roughness of less than 2 nm root mean square (RMS), or in another embodiment, less than 1 nm RMS. Additionally, in one embodiment, the dielectric layer surface roughness may be less than 1 nm RMS.

In a second embodiment, polishing the conductive structure may include maintaining a uniform conductive structure removal rate. Additionally, polishing the conductive structure may be controlled by a reactive liquid slurry.

In a third embodiment, polishing the barrier layer may include removing any excess barrier layer outside of the openings. Additionally, polishing the barrier layer may include simultaneously removing at least a portion of the conductive material, at least a portion of the barrier layer, and at least a portion of the dielectric layer. A rate of removal associated with the polishing the barrier layer may control a depth of the conductive structure and a degree of a slope of the portion of dielectric layer adjacent to the barrier layer and/or conductive structures.

In a fourth embodiment, a selectivity associated with the polishing the barrier layer may control a depth of the conductive structure and a degree of a slope of the dielectric layer. For example, the selectivity may be a ratio of the removal rate of two different materials. The selectivity of the conductive structure to the dielectric layer may be a ratio of a removal rate of the conductive structure divided by a removal rate of dielectric layer.

In a fifth embodiment, the selectivity may include modifying metal layer parameters including at least one of a barrier metal type, a barrier metal thickness, or an erosion rate of a barrier metal. For example, the barrier metal types may include at least one of titanium in use with a Cabot EPOCH C8902 copper slurry, or titanium or tantalum (or compounds based on any of such elements) in use with a Dow ACuPLANE™ LK393. The selectivity may be effected by modifying polishing consumables including at least one of a polishing pad, a slurry type, a flow rate, slurry dilution, polishing pressures, or a conditioning disc type. For example, the polishing pad may include one of Suba™ 500 or DOW IC1000™ type pads. Additionally, the selectivity may include modifying polishing parameters including at least one of a platen speed, a wafer carrier speed, a slurry flow, a downward force, or a pad conditioning type. For example, increasing the slurry flow may decrease a dishing of the conductive material, or decreasing the slurry flow may increase the dishing of the conductive material. In one embodiment, such slurry flows may be applied in the context of polishing a 200 mm conductive structure.

In a sixth embodiment, one or more bonded structures may include a continuous conductive structure exposed at both a front and backside of the one or more bonded structures. In one embodiment, one or more bonded structures may include a bonded substrate. Additionally, both the front and the backside of the one or more bonded structures may be planarized such that a surface corresponding to each of the front and back sides of the one or more bonded structures is not recessed more than a predetermined amount.

Some of the disclosed processes may be illustrated using block flow diagrams, including graphical flow diagrams and/or textual flow diagrams. The order in which the disclosed processes are described is not intended to be construed as a limitation, and any number of the described process blocks can be combined in any order to implement the processes, or alternate processes. Additionally, certain individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments of techniques for chemical mechanical polishing (CMP) for hybrid bonding, are disclosed. A dielectric layer may include dielectric erosion (or a rounding of the surface of the dielectric layer), and a conductive structure may include dishing, both due to CMP, and both of which may negatively affect bonding. The disclosed techniques improve the planarization of the dielectric layer and the control of conductive structure dishing.

In various embodiments, using the techniques disclosed herein can improve the stacking process for bonding techniques, and increase the reliability and yield of stacked structures. Dies to be stacked and bonded using surface to surface direct bonding techniques without adhesive, such as "ZIBOND®," and/or hybrid bonding, such as "Direct Bond Interconnect (DBI®)" both available from Invensas Bonding Technologies, Inc. (formerly known as Ziptronix, Inc.), an Xperi Technologies company (see for example, U.S. Pat. Nos. 6,864,585 and 7,485,968, which are incorporated herein in their entirety), which can be susceptible to dielectric erosion and conductive structure dishing (which have a high need for an extremely flatness controlled interface), can particularly benefit. The planarization of the surface of the dielectric layer may be used to decrease dielectric erosion (and/or rounding of the dielectric layer). Controlling the conductive structure dishing may improve the ability of two surfaces to bond intimately as well as to ensure conductive structures properly contact across the bonding interface.

In fabricating wafers for hybrid bonding, factors that may improve hybrid bonding (including both yield and reliability) include: 1) planarizing the surface of the dielectric layer or substrate, and 2) minimizing the amount of conductive structure dishing. For example, hybrid bonding may be improved by forming planar dielectric bonding surface(s) with minimal dielectric erosion and controlled dishing (i.e. recessing) of the conductive structures of interest prior to a subsequent bonding operation.

In one embodiment, a plated barrier and/or conductive layer may be applied in a uniform manner. For example, a non-uniformity of the plated barrier or conductive layer may be less than 7% up to the edge exclusion of the substrate. Additionally, it is preferable to limit nonuniformity of the barrier layer or the conductive layer to under 3% up to the edge exclusion of the substrate or wafer.

If an as-formed conductive layer has poor uniformity, polishing the substrate may cause excessive dishing defects in the conductive structure of interest, as longer polishing times (needed to remove the excess conductive structure) in some portions of the conductive structure may cause over polishing in other portions of the substrate where the barrier layer has been revealed.

For example, if a polishing time to remove a portion of the conductive structure over a barrier layer around the center of the substrate is 300 seconds, and an additional 120 seconds may be needed to remove a portion of a remaining conductive structure near the periphery of the substrate, the additional 120 seconds may be construed as over-polishing time. The 120 seconds over-polishing time (or 40% over polishing times computed by 120/300*100) may be used to remove the conductive layer near the periphery of the substrate.

In this manner, a first predetermined amount of recess at or around the center of the substrate (for example where the conductive structure may be located) may be higher than a first predetermined amount of recess at or around the periphery of the substrate (e.g., wafer or panel). In one embodiment, the first predetermined amount of recess may be uniform across the substrate and may be less than 60 nm before the removal of the barrier layer. In another embodiment, the first predetermined amount of recess may be less than 40 nm before the removal of the barrier layer. The recess may be measured from a surface such as the surface of the barrier layer, the bonding surface, or the bonding plane as defined by the interface between two bonded surfaces.

Similarly, over-polishing a barrier layer or the dielectric layer may increase a dielectric erosion of the dielectric layer in the portions of the dielectric layer adjacent to the barrier layer. As such, in one embodiment, over-polishing times of the conductive structure or of the barrier layer may be less than 30% of over-polish time. In one embodiment, over-polishing times of the conductive structure or of the barrier layer may be less than 10% of over-polish time. As an example, a time needed to polish a conductive structure to reveal a barrier layer may be 300 seconds to include a 10% over-polishing time. In particular, the over-polishing of the barrier layer may be less than 10% of over-polishing time.

In one embodiment, the polishing process may be used to control a recess in the conductive structure and to form a second predetermined amount of recess in the conductive structure. Additionally, in an embodiment, a removal rate of the dielectric layer and of the conductive structure within the opening (or damascene cavity) and the barrier layer may be very similar after a barrier layer has been removed from the surface of the dielectric layer.

In another embodiment, conductive structure dishing ranging from 1 to 10 nm may be sufficient for achieving acceptable DBI bonding surfaces. Copper chemical mechanical polishing (CMP) and barrier metal CMP may be used to achieve planarization of the bonding surface of the dielectric layer and/or minimizing the amount of conductive structure dishing. For example, copper CMP and barrier CMP steps may each be modified by adjusting consumables (such as the pad, slurry, etc.) and polish parameters. In this manner, removal rates of the dielectric layer, portions of the conductive layer/structure (such as copper), and barrier metal may be adjusted to meet the requirements of the overall CMP processes to achieve planarization of the surface of the dielectric layer and/or optimal conductive structure dishing. In one embodiment, the copper CMP and barrier metal CMP may be applied in the context of copper interconnection technology that includes a dielectric layer.

As described earlier, the first predetermined amount of recess in the conductive structures is formed after polishing the conductive layer to expose the barrier layer across the substrate. Similarly, the second predetermined amount of recess in the conductive layer may be formed after removing the barrier layer from the surface of the substrate or dielectric layer. The barrier layer may be removed by CMP methods and in other embodiments, the barrier layer may be selectively removed by for example by reactive ion etching methods (RIE) or even wet etch methods.

Still yet, a second predetermined amount of recess in the conductive structures may be uniform across the substrate or dielectric layer and may be less than 30 nm. Further, the second predetermined amount of recess may be less than 15 nm. The second predetermined amount of recess may be smaller than the first predetermined amount of recess. In one embodiment, after planarizing the appropriate surface, the planarized bonding surface may be cleaned and prepared for bonding operations. For example, the bonding surface preparation step may include exposing the bonding surface to oxygen or nitrogen plasma (or both). In one embodiment, the exposure may occur in air or within a vacuum. The bonding surface preparation step may include forming a third predetermined amount of recess in the conductive structure. In some applications, after the barrier removal step, the bonding surface may be coated with a protective layer for substrate singulation processes. After the singulation step, the protective layer may be removed from the bonding surface typically by a wet cleaning technique. The protective layer cleaning step may include exposing the bonding surface to plasma species comprising oxygen. These subsequent process steps may modify the recess in the conductive structures of interest, the new recess being a third predetermined amount of recess. The third predetermined amount of recess or dishing may range from 1 to 20 nm, and preferably is less than 10 nm. In one embodiment, the first predetermined amount of recess may be larger than the third predetermined amount of recess.

The dielectric layer may comprise one or more layers of oxides, nitrides, or carbides of silicon, diamond, diamond like carbons (DLC), low dielectric constant material, glass, ceramic materials, glass ceramics, polymeric materials, and/ or combinations thereof. In one embodiment, the dielectric layer may be deposited on a substrate, including a wafer or die (such as direct or indirect band gap semiconductor materials). Additionally, or alternatively, a bonding surface may include a dielectric layer formed upon a dielectric material substrate or a package with embedded dies or conductive layers.

In the context of the present description, the term conductive structure may refer to a layer of any conductive material, and conductive structure dishing may refer to any dishing associated with the conductive structure or structures of interest. As described herein, a conductive layer may first be formed on the barrier followed by a removal process that leads to continuous or discontinuous conductive structures. Further, the conductive structure may comprise materials such as copper, nickel, cobalt, gold, tin, and the like, and/or any alloy based on such elements.

In one embodiment, bonded structures (including a substrate layered with a dielectric layer and a conductive structure) may include dissimilar materials, where each or any of the substrates, dielectric layer, barrier layer, and/or conductive structure may include a different coefficient of thermal expansion or Young's modulus. As such, the bonded structure may include similar or dissimilar materials. Further, one of the bonded structures may include one of an active, passive (such as a capacitor, inductor, resistor, etc.), optical (e.g. laser, light emitting diodes, etc.) or mechanical device and/or resonating cavity, or combination thereof.

Still yet, in one embodiment, the dielectric layer may be formed or modified to include one or more openings to accommodate one or more conductive structures (or pads) of similar or varying dimensions at uniform or varying pitches or even with nonuniform placement. As an example, a bonding surface of the dielectric layer may include one or more cavities or openings within which may be a conductive pad. The width of the conductive pad may be more than 50% of the width of the trench. In one embodiment, a width of the pads may range from 2 to 200 microns, and a pitch of a pair of pads may vary from 1 to 8 times the width of the pad. In another embodiment, the width of the pads may range between 5 and 50 um, and the pitch of the pads may vary from 1.2 to 5 times the width of the pads. In some embodiments the pads or conductive structures of interest may electrically be connected to another conductive layer beneath or laterally.

A profile view of dielectric erosion and conductive structure dishing of a microelectronic element 100 is shown at FIG. 1. A first wafer 102 may include a base layer 103 (not shown to scale), such as a semiconductor, as well as portions of a dielectric layer 104 with a curved surface that represents dielectric erosion. In one embodiment, the dielectric layer 104 may be an oxide layer, in which case the dielectric erosion may also be referred to as oxide rounding. Additionally, the first wafer 102 may include a conductive structure 106 with a typically-concavely curved surface that represents conductive structure dishing. Further, a recess 108, which bisects the bonding plane, may be created as a result of the dielectric erosion of the dielectric layer 104 and the conductive structure dishing of the conductive structure 106.

Figure 2:
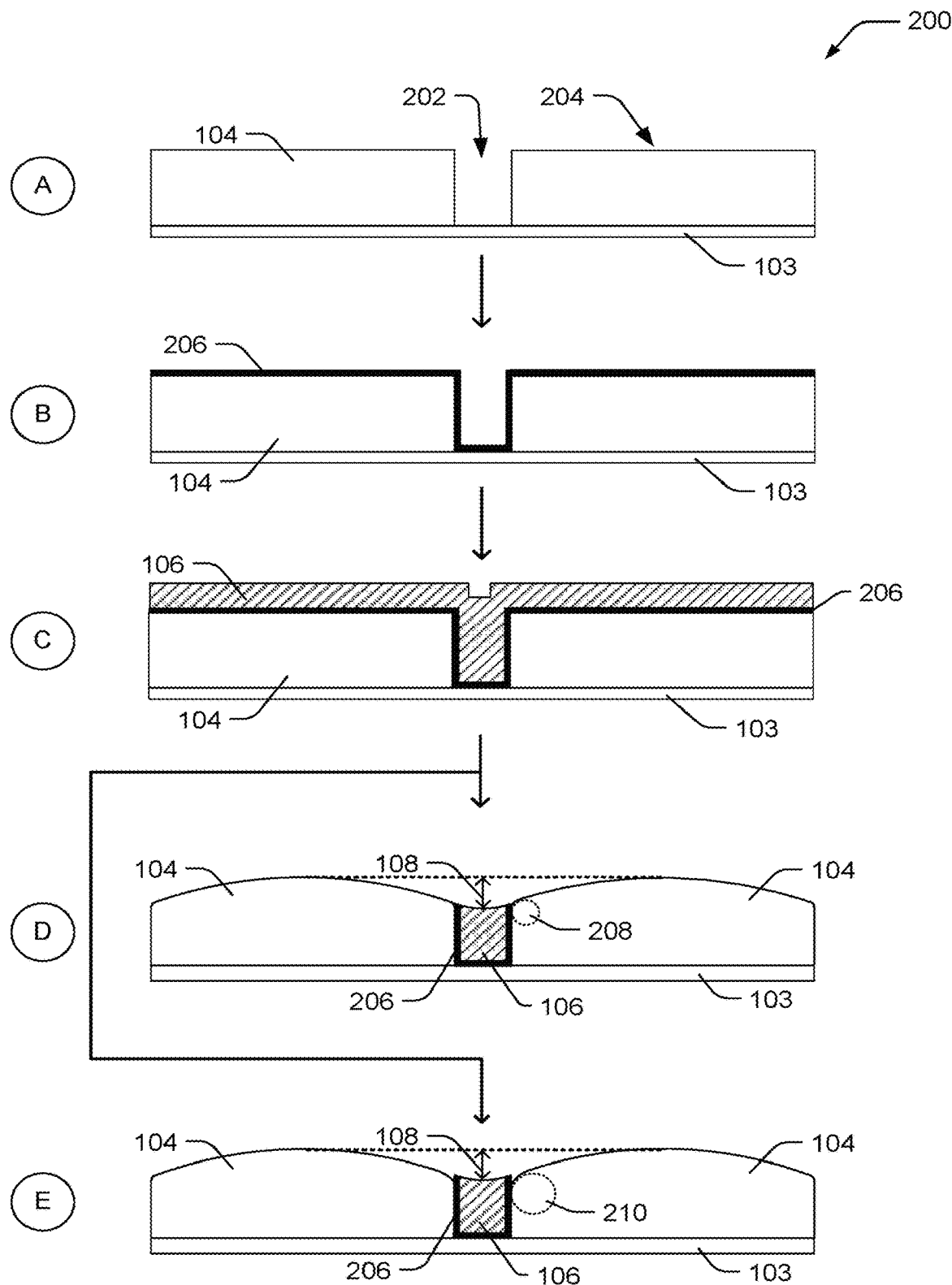
FIG. 2 shows a process that results in oxide rounding and conductive structure dishing.

FIG. 2 shows a process 200 of conductive structure formation. As shown at step A, the dielectric layer 104 may include one or more cavities 202 (or openings) formed on the surface 204. The width of the cavities may vary between 0.3 microns to more than 50 microns. The depth of the cavities may range between 0.3 microns to more than 20 microns and may be part of, or extend to, a conductive via that extends through the substrate. In some embodiments, the cavities may comprise thru-substrate cavities, such as through base portion 103 (not shown to scale). At step B, the surface 204 may be lined with a layer 206, such as a barrier layer and/or a seed layer. Depending on the depth of the cavity 202, a thickness of the layer 206 (such as a barrier layer) may vary between 1 and 100 nm, for example. In one embodiment, the thickness of the barrier layer 206 may be between 3 and 50 nm. Additionally, the layer 206 as a barrier layer may be comprised of tantalum, titanium, nickel, ruthenium, cobalt and tungsten, or the like, alloys or compounds and/or derivations thereof. In one embodiment, the layer 206 may serve as a barrier and as a seed layer for forming a layer of a conductive structure 106.

At step C, the conductive structure 106 may be formed over and/or within the layer 206. After forming the conductive layer 106, portions of materials may then be removed, such as by CMP, to form conductive structures. Additionally, it is to be appreciated that although layer 206 is not explicitly shown at steps C-E, layer 206 may nonetheless be included below and/or to the sides of the conductive structure 106.

At steps D and E, effects of the removal of materials are shown, which may include planarization of the surface of the substrate 104, dielectric erosion, and conductive structure dishing. The examples at steps D and E provide two example outcomes of dielectric erosion (or "rounding"), which can be modelled using a portion of a circle having a radius of curvature associated with a shape of the dielectric erosion, to describe the magnitude of the erosion. For example, the dielectric erosion at step D can be represented by a circle having a smaller radius of curvature 208, while the dielectric erosion at step E may be represented by a circle having a bigger radius of curvature 210. The size of the radius of curvature 208 and 210 can describe how steep the rounding is (curvilinear surface) at the intersection of the dielectric 104 with the conductive structure 106 (including how steep is the approach), and how much of a gap results at the intersection due to the erosion. Note that in this description, the circle with radius of curvature 208 or 210 is used to model the portion of the erosion at the intersection of the dielectric 104 with the conductive structure 106 (or the barrier between the dielectric and the conductive structure) and may not necessarily represent the overall rounding of the dielectric 104. The size of the radius of curvature 208 and 210 can be an indicator as to the likelihood of potential issues with intimate bonding. The smaller the radius of curvature the smaller the dielectric erosion. As such, dielectric erosion (or rounding) of the dielectric layer 104 may prevent intimate contact with an opposing surface. In another approach, the tangent of the complement of the angle between the intercept of the eroded dielectric layer and the barrier layer with respect to the dielectric surface is a measure of the dielectric erosion (the dielectric erosion angle). The smaller the dielectric erosion the smaller the value of the said dielectric erosion angle. For an ideal case where there is no dielectric erosion, the value of the dielectric erosion angle is zero and the tangent of the dielectric erosion angle is thus 0. Other geometric descriptive adjectives may be used to describe the dielectric erosion; in general, it is preferable that the dielectric erosion angle is less than 30 degrees and preferably less than 10 or even 1 degrees where the tangent of the dielectric erosion angle is close to 0. In one embodiment, the dielectric erosion (tangent of the dielectric erosion angle) is less than 5 nm/micron and preferable less than 1 nm/micron.

Step D also illustrates that the conductive structure may be level with or recessed locally relative to the dielectric 104

(i.e. where the surface of the conductive structure 106 is closest to the surface of the dielectric 104) by an amount less than the recess 108. In contrast, Step E illustrates the conductive structure protruding locally relative to the dielectric 104 (i.e. where the surface of the conductive structure 106 is closest to the surface of the dielectric 104) while also being recessed relative to the bonding surface by recess 108.

Materials removed during CMP may include portions of the conductive layer and structure 106, portions of the barrier layer (such as the layer 206), and/or portions of the surface of the dielectric layer 104. In one embodiment, the larger the radius of curvature (of the dielectric erosion 208 and/or 210), the larger the potential for defects in the bonding of the dielectric layer 104 to another prepared surface. As such, a smaller radius of curvature, or smaller dielectric erosion, may indicate less potential for defects between the opposing bonding layers or surfaces.

Figure 3:
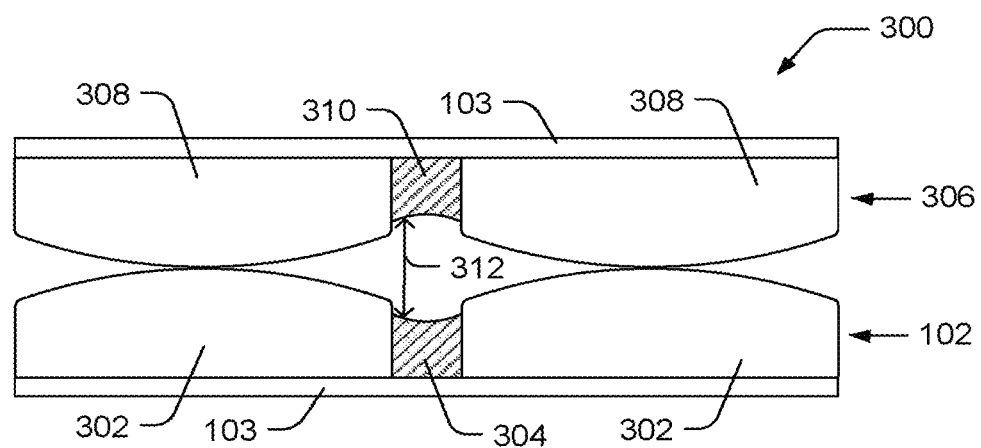
FIG. 3 shows a profile view of stacked wafers showing oxide rounding and conductive structure dishing.

FIG. 3 shows a profile view 300 of stacked wafers 102 and 306 showing excessive dielectric erosion and conductive structure dishing. As shown, the first wafer 102 may include a base layer 103 (not shown to scale), a first dielectric layer 302 showing dielectric erosion, and a first conductive structure 304 showing conductive structure dishing. Additionally, a second wafer 306 may include a second dielectric layer 308, and a second conductive structure 310. When the first wafer 102 and the second wafer 306 are stacked, a gap 312 may be created between the first wafer 102 and the second wafer 306. The gap 312 may result from the conductive structure dishing, and/or the dielectric erosions 208 and 210. In one embodiment, the gap 312 may prevent an intimate surface to surface bond between the first dielectric layer 302 and the second dielectric layer 308. In one embodiment, at higher temperatures the intimate contact between the first conductive structure 304 and the second conductive structure 310 can be established, but a continuous, intimate surface to surface contact between the bonding surfaces of dielectric 308 and 302 is less likely.

Figure 4:
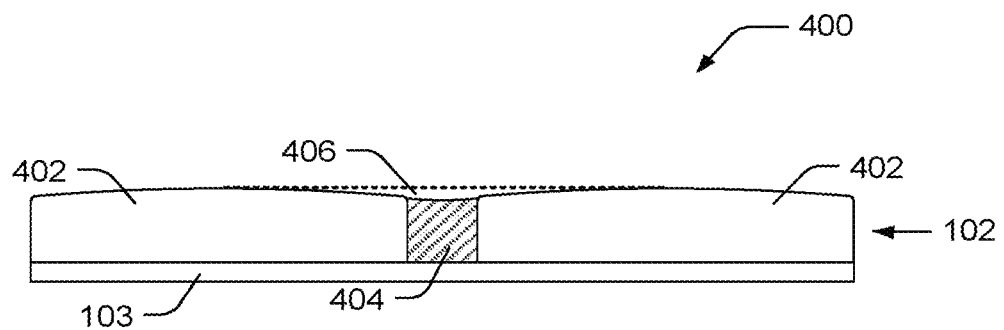
FIG. 4 shows a profile view of reduced oxide rounding and reduced conductive structure dishing, according to an embodiment.

In contrast, FIG. 4 shows a profile view of a microelectronic component 400 having reduced dielectric erosion and reduced conductive structure dishing, according to one or more embodiments described herein. A first wafer 102 includes a base layer 103 (not shown to scale), a dielectric layer 402 with minimal dielectric erosion for directly or indirectly on base layer 103, and a conductive structure 404 with minimal conductive structure dishing or recessing from a plane or surface, such as the bonding interface or the planar bonding dielectric surface. As a result of use of techniques disclosed herein, recess 406 is minimal (especially in comparison to the recess 108 shown in the preceding figures). In one embodiment, the recess 406 may not substantially exist. For example, the dielectric erosion of the dielectric layer 402 and conductive structure dishing of the conductive structure 404 may not be present, causing the recess 406 to not exist. In one embodiment, the bonding surface of the dielectric layer 402 can be characterized as substantially planar and the recess in the conductive layer preferably less than 5 nm. substrates with these types of surface attributes may be bonded at temperatures lower than 150° C.

In some embodiments, forming (for example, electroplating) a conductive layer may be accomplished through use of a plating bath including super-filling additives which may be used to ensure a void-free filling. In other embodiments, the conductive layer may be formed by combination of various methods including atomic layer deposition, electroless plating, sputtering, evaporation, laser deposition and the like. Additionally, the conductive layer may be thermally treated between room temperature and below 250° C. for a predetermined amount of time. In one embodiment, the conductive layer was thermally treated at temperatures below 100° C. The conductive layer may be formed over a seeded surface (such as the layer 206, not shown). Additionally, in one embodiment, uniform coating of the conductive layer across the surface of the dielectric layer 402 may be achieved such that the non-uniformity of the conductive layer is less than 7% up to the edge exclusion of the dielectric layer 402. In another embodiment, the non-uniformity of the conductive layer may be less than 3% up to the edge exclusion of the dielectric layer 104.

Additionally, a thickness of the conductive layer may range from 0.3-200 um. In one embodiment, the thickness of the conductive layer may range from 0.3-20 um. The conductive layer may be formed into conductive structures 404 such as dual damascene structures, traces, through substrate vias (TSVs), and the like. Further, any undesired materials (to be removed) may comprise of unwanted portions of material used for the conductive structure 404, unwanted portions of a barrier layer, and/or unwanted portions of the dielectric layer 402.

An intersection of a surface of dielectric 402 to conductive structure 404 (or to adjacent layers, such as the barrier within the opening), based on a radius of curvature of the dielectric erosion (of the dielectric layer 402) may be less than 10% of the depth of the conductive structure 404. In an example to reduce rounding erosion, a polishing pressure for the conductive structure 404 and the barrier layer may vary between 0.3 to 5 psi, and any over-polishing times may be kept below 30% to control conductive structure dishing and/or minimize dielectric erosion (or rounding). Further, a polishing pressure for the conductive structure and the barrier layer may vary between 0.5 to 3 psi, and any over-polishing times may be kept below 10% to control conductive structure dishing and/or minimize dielectric erosion.

In one embodiment, openings, including conductive pad, trenches, and/or cavities of the dielectric layer 402 may be of configured to have uniform, varying, or nonuniform dimensions, pitches, and layouts. In one embodiment, the conductive pad may be more than 50% of the width of the trench, which may also include any barrier layers or other conductive or insulating layers. Additionally, a width of the conductive pads may range from 2 to 200 um, and the pitch of a pair of pads may vary from 1.1 to 8 times the width of the pad. In another embodiment, the width of the conductive pads may range from 5 to 40 um, and the pitch of a pair of pads may vary from 1.2 to 5 times the width of the pad. Further, a local periodicity of conductive structures within a particular region of the first wafer 102 or die may be different from a periodicity of a separate grouping of conductive structures on the first substrate 102, e.g. wafer, panel, or die.

Figure 5:
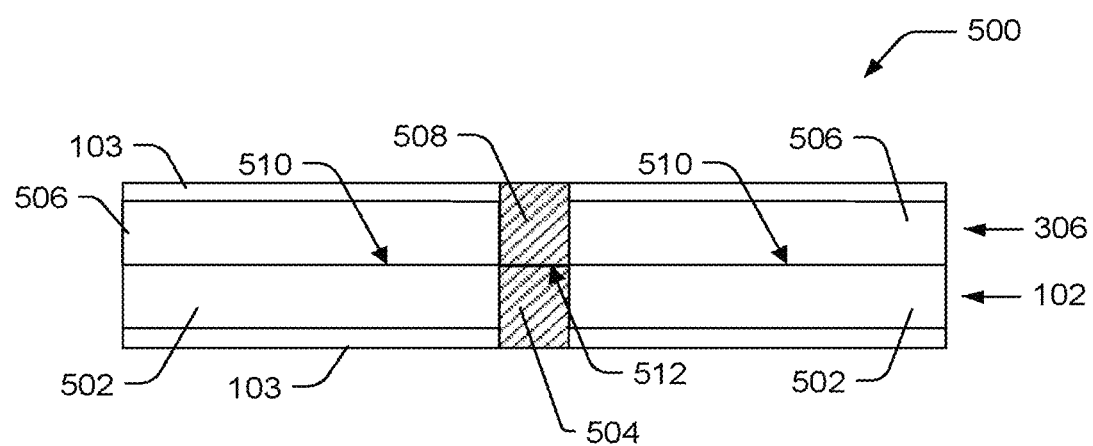
FIG. 5 shows a profile view of stacked wafers, according to an embodiment.

FIG. 5 shows a profile view of stacked dies, wafers, or the like, according to an embodiment. The stacked components may comprise a microelectronic assembly 500 of two dies, as shown, though more dies may be stacked as desired or required for a given design. As shown, the first substrate 102 may include a first base layer 103, a first dielectric layer 502 and a first conductive structure 504. Additionally, the second substrate 306 may include a second dielectric layer 506 and a second conductive structure 508. As a result of using the techniques disclosed herein, dielectric erosion 510 and conductive structure dishing 512 may be reduced or even nearly eliminated. As such, the surface of the dielectric layer 502 may be reliably intimately bonded to the surface of the dielectric layer 506, and/or the surface of the conductive structure 508 may be intimately bonded to the surface of the conductive structure 504.

In particular, the bonding surface of the first dielectric layer 502 and the second dielectric layer 506 may be planar (as shown by a lack of dielectric erosion 510) or near planar (minimal amount of dielectric erosion that does not affect hybrid bonding). Additionally, the surface of the first conductive structure 504 and the second conductive structure 508 may be planar (as shown by minimal or non-existent conductive structure dishing 512) or near planar (minimal amount of conductive structure dishing that does not affect hybrid bonding).

In various embodiments, conductive structure dishing or recess 512 may be present, and may be preferable in a predetermined minimal amount. For example, some expansion of conductive structures 504 and 508 may be predicted during annealing or operation. As such, a predetermined minimal amount of dishing 512 or recess may provide room for expansion of one or both conductive structures 504 and 508, which can prevent stress, including delamination of dielectric layers 502 and 506 during annealing. Moreover, in bonded form, at least one conductive structure on or in at least one of the substrates 102 and 106 may extend across the bonding interface defined by the bonded dielectric layers while the corresponding conductive structure in the other substrate may remain somewhat recessed after bonding. However, the combined expansion of the conductive structures during or after bonding will result in contact of the structures.

Additionally, as shown in FIG. 5, the stacked wafers may include a conductive structure exposed at more than one surface of the bonded stacked wafers (including for example the first wafer 102 and the second wafer 306). The back surface of such stacked wafers or substrates may be cleaned and the said surface with the predetermined amount of recess in the conductive structures, typically with yet a third predetermined recess, is prepared for bonding operations. Another prepared surface with the required predetermined recess in the conductive layers may be bonded to the cleaned and prepared backside of the pre-bonded substrate 102 or 306. In one embodiment, a bottom substrate may be stacked consecutively with multiple substrates (from 2 to 100) using the presently disclosed techniques. The stacked substrates are thermally treated below 300° C. and preferably below 200° C. for times varying between 30 to 180 minutes. The thermal treatment may be applied after each bonding step or may be applied once all bonding is completed to anneal the entire stack simultaneously. In some applications, requiring lower bonding temperatures may lead to longer thermal treatment times in order to ensure conductive structures contact across the bonding interface. In some applications the bonding surfaces of both opposing substrates are prepared for bonding operation, in other cases, only one of the bonding surfaces of the two mating substrates is prepared prior to the stacking operation.

As shown in FIG. 5, either or both conductive structures 504 and 508 may be through substrate vias (TSVs) and such TSVs may be provided on a substrate with other conductive structures, such as traces, contact pads, that do not extend through the substrate.

In various implementations, copper polish CMP may be used to reduce conductive structure dishing. Before implementing copper polish CMP, but after forming the conductive layer, a surface of the conductive layer may be provided with a barrier metal (such as found on layer 206). This additional barrier layer may further ensure planarity by filling recesses in the copper layer with the harder barrier layer before any CMP is commenced.

Example Implementations

Starting with a wafer with a generally uniform conductive layer surface (e.g. FIG. 2C), a copper and barrier layer CMP may feature: 1. A first polishing step performed on the conductive layer with a uniform conductive material removal rate with minimal over-polishing times to form conductive structures with a first amount of recess as measured from top surface of the barrier layer; 2. A second polishing step performed by applying a high selectivity barrier slurry to polish the barrier metal with minimal over-polishing times to form conductive structures with second predetermined recesses as measured from the top surface of the dielectric layer or from a bonding plane defined by the top surface of the dielectric layer. The dielectric has minimal dielectric erosion such that the dielectric erosion angle is less than 10 degrees and preferably less than 5 degrees. It is also preferable that the second predetermined recess be smaller than the first predetermined recess.

In one embodiment, for copper polishing, reactive liquid slurries (such as Dow ACuPLANE™ LK393 copper slurry and Cabot EPOCH C8902 copper slurry) may be used for copper polishing. For example, use of the reactive liquid slurry Cabot EPOCH C8902 slurry may react adversely to barrier materials (e.g. TiN, TaN, etc.), such that copper polishing may be significantly reduced when the underlying barrier materials are partially exposed (for example at an edge of the wafer 102). Consequently, the nature of the barrier layer should be considered when selecting the appropriate conductive layer removal slurry.

The barrier metal polish step (such as for a barrier material of layer 206) may remove any excess barrier metal from the surface of the wafer (such as the wafer 102) and may be used to control a final dishing value of the copper DBI pads. In one embodiment, barrier metal polish may be used to correct any non-uniformities present after the copper polish step. However, it is to be appreciated that, as indicated above, a focus of the copper polish step is to form uniform or near uniformly recessed conductive structures across the substrate while maintaining the barrier metal as uniform as possible across the substrate.

The barrier metal polish steps may remove various types of material simultaneously, including, but not limited to, conductive material (such as that used for conductive structure 106), metal barrier material (such as a barrier material of layer 206), and a solid dielectric material (such as silicon oxide used in the dielectric layer 402) to form the second predetermined recess in the conductive structures. The relative rate of removal of the barrier metal polish step may control a relative recess on the surface of the conductive structure 404 to the surface of the dielectric layer 402 (such as the second predetermined recess in the conductive structures), and/or a degree of dielectric slope (such as dielectric erosion angle)

For example, the rate that the dishing of the surface of conductive structure 404 changes (as shown herein by the conductive structure 404 with a curved surface that represents conductive structure dishing), and the rate at which the rounding of dielectric erosion increases (as shown herein, for example, by dielectric erosion 208 which may result in a smaller radius of curvature or shallower slope for the dielectric erosion angle, and dielectric erosion 210 which may result in a larger radius of curvature), may be controlled by a selectivity of the respective material (such as the conductive material and/or dielectric material). Such selectivity may include a ratio of a removal rate of two different materials. For example, the selectivity of a conductive material (such as copper) to dielectric material (such as oxide) may be the ratio of the removal rate of the conductive material divided by the removal rate of the dielectric material. As such, controlling the selectivity may affect the relative depth of the surface of the conductive structure to the dielectric surface (conductive structure dishing), and a degree of slope (dielectric erosion angle).

With respect to selectivity, one way to achieve a desired set of topographic features may be to adjust the selectivity such that the desired set of features may all be achieved within a certain interval of polish time. For example, this simultaneous optimization may include constructing a time-evolution plot of the features of interest using different selectivities, such as conductive structure dishing (or a recess) and dielectric erosion (or rounding). Such a plot may be used to determine if the applied process achieved the desired performance within a single time interval. This plot may allow for a visual mapping of the data such that progression and deficiencies (of the performance) may be easily spotted, and a determination as to how the selectivity should be modified (to achieve the desired results) may be made.

Parameters that may be modified relating to the selectivity may include metal layer parameters of the wafer, polishing consumables, and/or polishing parameters. The barrier metal layer parameters (such as metallic nitrides), which may be customized, include a barrier metal type, a barrier metal thickness, and/or an erosion rate of barrier metal (for example as during the copper polish). The polishing (using CMP) consumables, which may be adjusted, include polishing pad(s), slurry type (polishing slurry, slurry mix), slurry flow rate, slurry dilution and/or conditioning disc type. The polishing parameters (such as primary CMP tool parameters), which may be adjusted, include platen speed, wafer carrier speed, slurry flow, downward force applied to the wafer, and/or pad conditioning parameters. In various embodiments, the metal layer parameters, the polishing consumables, and/or the polishing parameters may be adjusted to give desired results, including minimizing or eliminating dielectric erosion and conductive structure dishing.

Metal Layer Parameters

In one embodiment, the type of barrier metal may influence the selectivity of the barrier metal to the copper polish. For example, titanium (Ti) may not have good selectivity to Cabot EPOCH C8902 copper slurry, whereas tantalum (Ta) may have good selectivity to the Cabot EPOCH C8902 copper slurry. Additionally, the Dow ACuPLANE™ LK393 slurry may have good selectivity to both to Ti,Ta and their nitrides as barrier materials. Choosing a barrier metal with good selectivity to the copper polish may assist in preventing excessive barrier metal erosion, unrecoverable conductive structure dishing, and dielectric erosion.

Additionally, a thickness of the barrier metal may be used to reduce final conductive structure dishing. For example, if the copper polish process results in higher levels of conductive structure dishing (first predetermined recess), the barrier layer may be made thicker to help accommodate extra dishing without adding significant dielectric erosion of the final structure. In one example, this may be accomplished for DBI patterns of 3-5 um diameter vias on a 10 um pitch with a Ti based barrier metal of up to 80 nm of thickness. After the copper polish step, the first predetermined recess in the conductive structure is 30-50 nm, a thicker Ti barrier may yield suitable DBI surfaces when used in combination with a Dow LK393 barrier slurry. Additionally, favorable results may be achieved using a thinner 25 nm Ta barrier when the copper polish dishing (first predetermined recess) is 10-20 nm.

Polishing CMP Consumables

During the CMP process, one or more pads or subpads may be used. Such one or more subpads may be softer than the primary polishing pad, and during the polishing operation the surface of the polishing, may be continuously reconditioned with an abrasive material to refresh the polishing surface to prevent the polishing surface from glazing. In one embodiment, a polishing pad with a subpad may be used for polishing the conductive structure. As such, to reduce defects in the polished conductive structure (such as the conductive structure 406), the barrier layer polishing pad may be harder than a polishing pad used for the conductive structure.

To achieve greater planarization, harder CMP pads may improve the ability to planarize the substrates. For example, Suba™ 500 type pads may be used for barrier polish. Additionally, DOW IC1000™ type pads may also be used to polish a variety of DBI patterns, including conductive structure with widths varying from less than 0.2 to over 200 microns with pitches varying between 0.5 to 8.

In one embodiment, to control the predetermined amounts of dishing in the conductive structure 404 and the barrier layer 206, harder CMP pads may be used to polish both the conductive structure 404 and the barrier layer 206. The durometer hardness of the pad may range between 45 and 90 in the Shore D scale. In one embodiment, the durometer hardness may be greater than 49.

Still yet, polishing slurry and slurry mix may be used to improve planarization. For example, removal rates of various materials may be affected by barrier slurry type and mixture. Dilution of the polishing slurry with water or other chemicals for example may reduce dielectric material and barrier metal polish rates while leaving the copper removal rate relatively high. As such, this dilution may be useful to control conductive structure dishing, such as when a surface of the conductive structure 404 protrudes above the surface of the dielectric layer 402 (see the example of FIG. 6).

Additionally, the copper removal rate may be controlled by reducing the amount of oxidizing agents such as hydrogen peroxide ($H2O2$) which is added to the slurry. For example, when using a Dow ACuPLANE™ LK393 barrier slurry, a copper removal rate may be reduced without substantially reducing a dielectric layer removal rate or barrier metal removal rate by reducing the $H2O2$ added to the slurry. In one embodiment, a reduction of the conductive structure removal rate may be reduced by as much as a factor of five (5) without substantially reducing the dielectric layer removal rate or barrier metal rate. Further, a conditioning disk which is compatible with the slurry type may be applied to the surface of the polishing pads during the polishing process to maintain predictable uniform removal rates for the conductive layer and the barrier layer.

Polishing Parameters

With respect to adjusting the platen speed, lower speeds may increase protrusion from decreased copper removal rates. Also, the higher speed of the pad may cause greater heating during polishing, thereby increasing the conductive material removal rate. A removal rate of the dielectric layer 402 and the barrier material 206 may increase with higher table speed. As such, wafer carrier speeds may be set to 6-10 revolutions per minute (RPM) slower than the table speed.

Slurry flow may additionally be used to control removal rates. For example, low slurry flows may be used to reduce the oxide polish rate while maintaining the conductive material removal rate. For example, a flow of 40 ml/min of the Dow ACuPLANE™ LK393 slurry may be used to polish DBI surfaces of 1-5 um diameter copper features on a pitch of 2× the diameter. In one embodiment, the 40 ml/min flow of the Dow ACuPLANE™ LK393 slurry on an embossed Suba™ 500 pad may reach a steady state conductive structure dishing of 3-10 nm. An inverse relationship of the dishing and slurry flow may also be achieved. For example, increasing the slurry flow may decrease the conductive structure dishing, and decreasing the slurry flow may increase the conductive structure dishing.

With respect to a downward force applied to the wafer, when using a LK393 slurry, the removal rates of all materials increase as the downward force increases. In one embodiment, when the copper bulk layer has been removed, a downward force may influence the conductive structure dishing. For example, a greater downward force may increase the conductive structure dishing (first predetermined recess), which is likely caused by increased heating associated with the greater downward force. Additionally, hydroplaning effects of the wafer may be used to control the amount of conductive structure dishing.

ADDITIONAL EXAMPLE EMBODIMENTS

Figure 6:
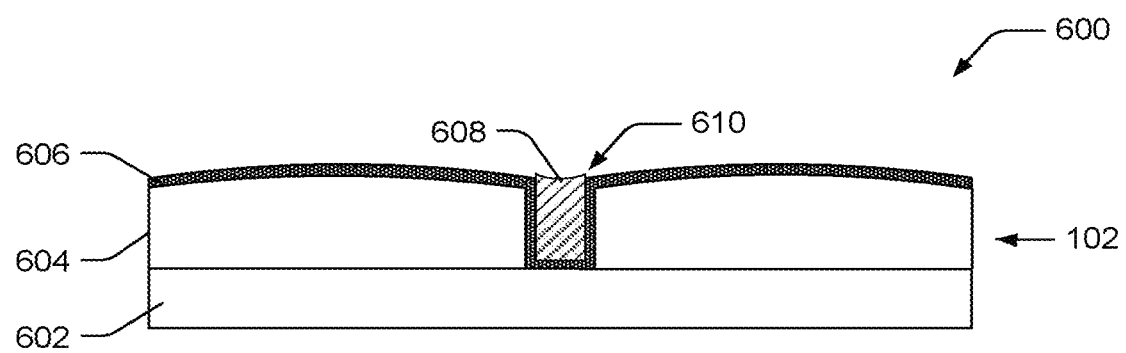
FIG. 6 shows a profile view of layers of a wafer, according to an embodiment.

FIG. 6 shows a profile view 600 of layers of the wafer 102, according to an embodiment. As shown, the wafer 102 includes a substrate layer 602, a dielectric layer 604, a barrier layer 606, and a conductive structure 608. It is to be appreciated that a substrate layer 602 may be equally present on any of the foregoing figures. For example, the dielectric layers 104, 302, 308, 402, 502, and 506 may each be deposited on an individual substrate (such as the substrate layer 602) or laminate of substrates.

In various embodiments, the substrate 602 and the dielectric layer 604 may be composed of similar materials with similar coefficients of thermal expansion (CTE), while in other embodiments, the substrate 602 and the dielectric layer 604 may be composed of dissimilar materials. Additionally, a CTE of the conductive structure 608 may be higher than the CTE of the dielectric layer 604. For instance, the CTE of the conductive structure 608 may be more than ten (10) times the CTE of the dielectric layer 604.

In one embodiment, the dielectric layer 604 may be deposited on the substrate layer 602 and patterned to form an opening 610. Of course, it is to be appreciated that any number of openings (including for example the opening 610) may be formed. Such openings may further be of a variety of widths, lengths, depths, and corresponding pitches. Additionally, the barrier layer 606 may be deposited on the dielectric layer 604 and within the opening 610. In some embodiments, the barrier layer 606 may be coated by atomic layer deposition, plasma sputtering, and/or chemical vapor deposition. Further, the conductive structure 608 may be deposited over the barrier layer 606 and within the opening 610, as described hereinabove (for example in FIG. 2). In one embodiment, the conductive structure 608 may be directly coupled to or in contact with electrical circuitry or conductive structures (not shown) also of the dielectric layer 604 and/or within the substrate layer 602.

As shown, after depositing of the barrier layer 606 and/or the conductive layer 608, both the barrier layer 606 and the conductive layer 608 may include an uneven surface. In one embodiment, the dielectric layer 604 may also include a curved or uneven surface. Subsequent polishing steps (as disclosed herein) may be used to planarize portions of the barrier layer 606 and portions of the conductive layer 608 to form conductive structures. Additionally, the conductive structure 608 may include a dishing and/or a protrusion, which may also be rectified using additional or alternative polishing steps (as disclosed herein). Moreover, the conductive structures may protrude above a portion of the dielectric proximate to the conductive structure while still being recessed relative to the bonding surface/plane.

Figure 7:
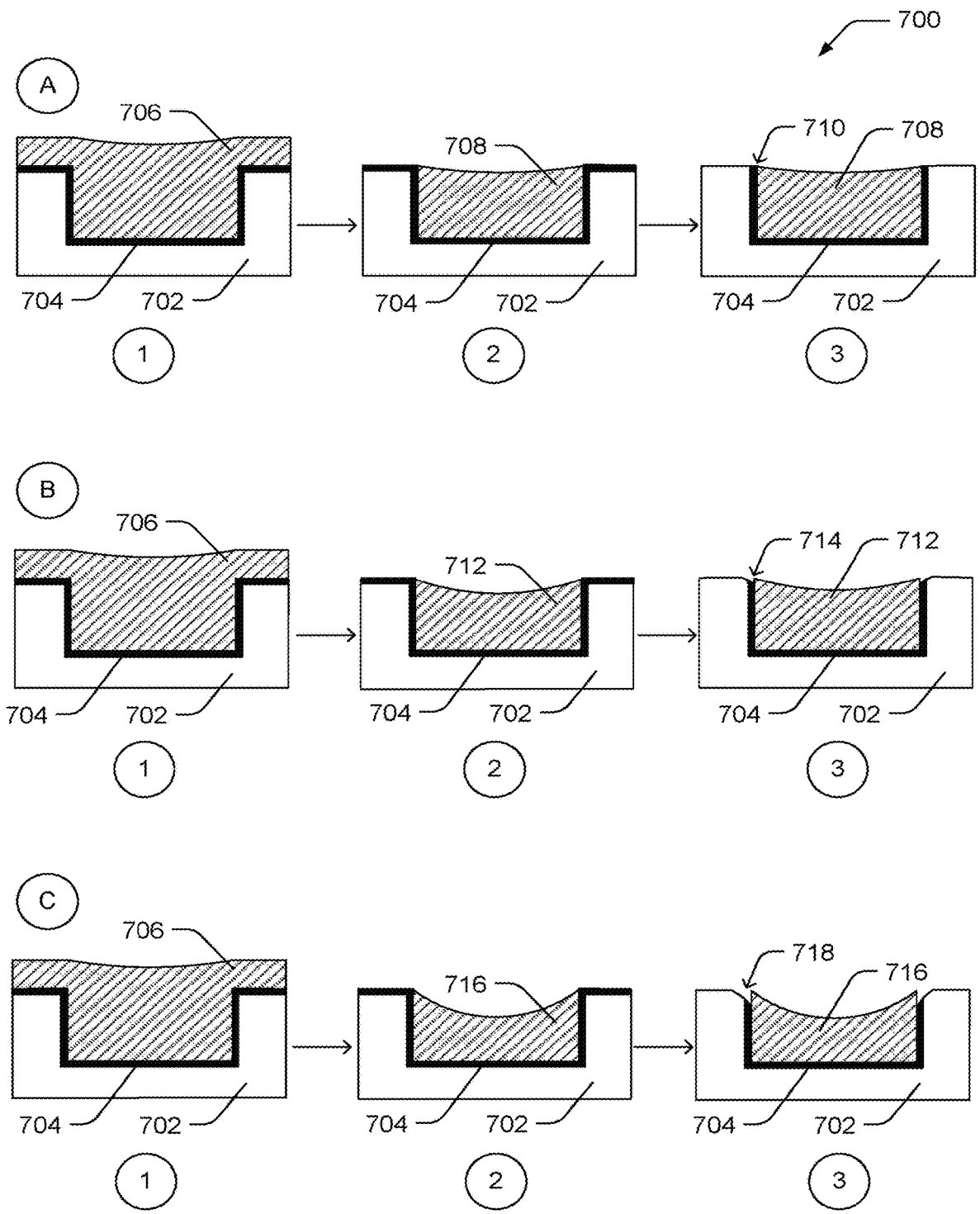
FIG. 7 shows processes for chemical mechanical polishing, according to an embodiment.

FIG. 7 shows example processes 700 for chemical mechanical polishing, according to an embodiment. In the processes, one or more of the process variables, such as the metal layer parameters, polishing consumables, and the polishing parameters may be adjusted to achieve desired results (e.g., minimizing dielectric erosion and minimizing conductive structure dishing). The three blocks (A, B, and C) will be discussed with the adjustments to the process variables discussed in relation to the three blocks. In general, it can be desirable to balance the process parameters that affect conductive structure dishing with the process variables that affect dielectric erosion ("rounding").

For instance, drivers for conductive structure recessing include the relative polishing rates (material removal rates per unit time) of the dielectric 702 (e.g., oxide) and barrier layer 704 (e.g., nitrides, etc.) to the polishing rate of the conductive structure 708 (e.g., copper); and the polishing time (which determines the amount of material removed at a given polishing rate). It should be noted that the polishing rates are different than bulk removal rates for each material. If the process parameters are adjusted accordingly, the polishing material removal rates for the dielectric 702, barrier layer 704, and the conductive structure 708 can eventually achieve a steady-state, and the recess level becomes constant (maintains a relative recess with respect to the upper surface of the dielectric 702) over the polishing time.

For example, at Block A Step 1, a barrier layer 704 may be deposited on a dielectric layer 702, and a conductive layer 706 may be deposited on the barrier layer 704. In one embodiment, the dielectric layer 702 may be analogous to the dielectric layer 104, and the conductive layer 706 may be analogous to the conductive structure 106. Further, the dielectric layer 702 and the conductive layer 706 may be found on an intermediate structure (e.g. wafer, interconnect structure, etc.) during the planarization of the conductive layer 706.

With reference to Block A at Step 2, a portion of the conductive layer 706 may be removed to create a conductive structure 708. In one embodiment, removing a portion of the conductive layer 706 may reveal the barrier layer 704 to form the first predetermined recess over the layer 608. Step 2 of block A includes polishing the barrier layer 704 such that a steady state material removal rate may be achieved, where a recess of the conductive structure 708 is maintained just below the upper surface of the dielectric 702 to form the second predetermined recess relative to the planarized bonding surface of dielectric 702.

In an implementation, to achieve such a steady state removal of material (i.e., polishing rate of removal and not bulk material removal), a rate of the material removal of the dielectric layer 702 and the conductive layer 706 (to create conductive structure 708) is adjusted to be as similar as possible to a rate of removal of the barrier layer 704. This comprises adjusting one or more of the process parameters and consumables to achieve a delicate balance, resulting in a wide process window and self-regulating of the recess in the conductive structure 708 throughout the polishing. In one embodiment, the recess of the conductive structure (first predetermined recess) 708 may be kept to less than 30 nm below the surface of the barrier layer 704 during polishing.

At Block A Step 3, after polishing the dielectric 702, the barrier layer 704, and the conductive structure 708 is completed (through use of CMP), a recess of the conductive structure (second predetermined recess) 708 may be less than 10 nm. Additionally, the recess of the conductive structure (second predetermined recess) 708 may be a fraction of the thickness of the barrier layer 704. In an embodiment with a thinner barrier layer 704, in instances where the thickness of the barrier layer 704 may vary between 3 to 25 nm, the second recess may be comparable to the thickness of the barrier layer after the barrier removal step. Further, dielectric erosion 710 may be minimal.

At Block B Step 1, the structure of the dielectric layer 702, the barrier layer 704, and the conductive layer 706 may be in a manner similar to block A Step 1, as herein described. At block B Step 2, a portion of the conductive layer 706 is removed (up to the surface of the barrier layer 704) to create a conductive structure 712. In one embodiment, a recess of the conductive structure (first predetermined recess) 712 may be 40-50 nm below the surface of the barrier layer 704, based on over-removal of conductive layer 706 material.

At Block B Step 3, after polishing the dielectric 702, the barrier layer 704, and the conductive structure 708 is completed (through use of CMP), a recess of the conductive structure (second predetermined recess) 712 may be less than 20 nm. Additionally, dielectric erosion 714 may be more pronounced (in comparison to dielectric erosion 710). Accordingly, the process parameters that determine the initial recess of the conductive structure 712 can have an impact on the final recess of the conductive structure 712.

A Block C Step 1, the structure of the dielectric layer 702, the barrier layer 704, and the conductive layer 706 may be in a manner similar to Block A Step 1, as herein described. At Block C Step 2, a portion of the conductive layer 706 is removed (up to the surface of the barrier layer 704) to create a conductive structure 716. In one embodiment, a recess of the conductive structure (first predetermined recess) 716 may be more than 60 nm below the surface of the barrier layer 704, based on over-removal of conductive layer 706 material.

At Block C Step 3, after polishing the dielectric 702, the barrier layer 704, and the conductive structure 708 is completed (through use of CMP), a recess of the conductive structure (second predetermined recess) 716 may be more than 30 nm, but greater than the recess of the conductive structure (second predetermined recess) 712. Additionally, dielectric erosion 718 may be more pronounced (in comparison to dielectric erosion 714). Accordingly, the process parameters that determine the initial recess of the conductive structure 716 can have an impact on the final recess of the conductive structure 716. Block C step 3 also illustrates that the conductive structure may protrude above local surfaces of the dielectric and barrier layers but still be flush or recessed with regard to the larger bonding surface. When multiple contact structures are placed in close proximity to each other, there may be a secondary surface which may be lower than the general bonding plane and above or below the contact structures.

In various embodiments, it may be beneficial to minimize a recess of the conductive structure (first predetermined recess) 708, 712, 716 before removing the desired portion of the barrier layer 704. Additionally, in order to reduce a recess (such as shown in the conductive structure 708) below 10 nm, process steps (e.g., chemistry, etc.) used for removal of the barrier layer 704 may be chosen to have good selectivity to the material used for the conductive layer 706 (e.g., copper). Also, if the recess of the conductive structure (such as the conductive structure 708) is less prior to barrier layer 704 removal, for instance below 10 nm, then the dielectric erosion (such as the dielectric erosion 710) may also be minimal, based on the process elements used.

In contrast, if the recess of the conductive structure 712, 716 is greater, for instance more than 60 nm, before removing the surface of the barrier layer 704 (as shown in the conductive structure 716), then the dielectric erosion (such as the dielectric erosion 718) may be more significantly increased.

Additionally, the dielectric erosion may be related to the thickness of the barrier layer (such as the barrier layer 704). For example, if the barrier layer is about 75 nm thick, and if the recess of the conductive structure (first predetermined recess) is about 75 nm, then the dielectric erosion may be minimal after the removal of the barrier layer. In contrast, if the barrier layer is about 40 nm thick, and if the recess of the conductive structure (first predetermined recess) is about 75 nm, then the dielectric erosion may be more significantly increased after the removal of the barrier layer.

In an embodiment, polishing the barrier layer 704 may be used to control a recess of the conductive structure (such as the conductive structure 708). For example, as discussed, one or more factors which may be used to control the recess of the conductive structure 708 include a polishing rate of the dielectric layer (such as the dielectric layer 702), a polishing rate of the barrier layer (such as the barrier layer 704), a polishing rate of the conductive structure (such as the conductive structure 708), and a polishing time. The polishing rates of the dielectric layer, the barrier layer, and the conductive structure may be configured such that a steady state removal of each may be achieved. It is to be appreciated that polishing of the dielectric layer 702 would not occur until a portion of the conductive layer 706 is removed (as shown in step 2 of Blocks A, B, and C). In a steady-state process, a recess of the conductive structure 708 may be held constant over the process time.

Additionally, in another embodiment, the polishing pressure may be used to control dishing and dielectric erosion (such as rounding of the dielectric surface, such as the dielectric erosion 710, 714, and/or 718). The higher the applied polishing pressure the higher the removal rate of both the conductive layer 706, the barrier layer 704 and the dielectric layer 702. Thus, the higher polishing pressures produces higher dishing in the conductive layer and higher erosion in the dielectric layer. Similarly, lower pressure produces the opposite effect with the accompanying penalty of lower thru-put. In one embodiment, the applied pressure may be graded. For example, the starting pressure for the conductive layer may be 4 psi for appropriate amount of times. Then, an intermediate polishing pressure may be 2.5 psi for the appropriate amount of times. The final polishing pressure to remove the conductive layer over the surface of the barrier layer may vary between 2 to 1.5 psi and stop on the barrier surface. Similarly, the polishing pressure for the removal of the barrier layer may be graded. As an example, the barrier layer removal pressure may vary between 2.5 to 0.5 psi The initial starting pressure may be 2 psi and the polishing pressure at the end of the barrier step maybe 0.7 psi. One advantage of the graded pressure approach is that the dielectric layer below the barrier layer is exposed to lower pressures which tends to be favorable to lower dishing for the conductive layer and very low to nonexistent dielectric erosion angles. In one embodiment, the polishing process may include a steady state removal process at some pressure where the removal rate of the conductive structures, the barrier layer and the dielectric layer are about the same. In this method, the first predetermined recess after polishing the conductive structures is similar to the second predetermined recess. The second predetermined recess may be modified by other additional steps, for example by further polishing of the said structure with diluted slurry, wet cleaning processes or oxygen or nitrogen bearing plasmas to form a third predetermined recess. In some applications substrates with bonding surfaces comprising of the second predetermined recesses may be prepared and bonded intimately. While in other embodiments a substrate with a bonding surface comprising of a second predetermined recess may be directly bonded to another substrate comprising a prepared surface with the third predetermined recess.

FIGS. 8A-8D show various example conductive pad 800 layouts, determining pad metal density on a surface of the die or wafer, according to an embodiment.

Figure 8A:
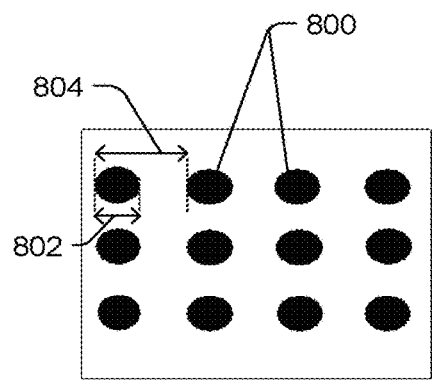
FIGS. 8A-8D show pad layouts based on metal density, according to example embodiments.

For example at FIG. 8A, with a conductive pad 800 arrangement as illustrated in the array of pads, the metal density is about 20% with respect to the dielectric. The pad size critical dimension (CD) 802 (representing a diameter of each conductive pad 800) with the array may be less than 20 um, for instance. A pitch 804 (or pad spacing) is equal to about two times the length of the CD 802.

Figure 8B:
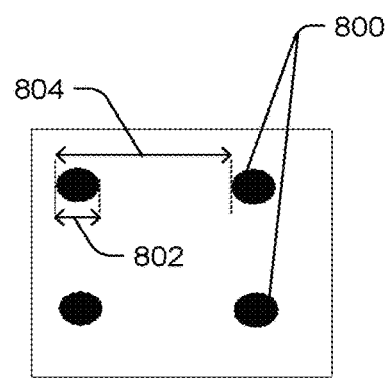

At FIG. 8B, with an example of a conductive pad 800 with arrangement as illustrated, the pad metal density is about 7% with respect to the dielectric. The CD 802 may also be less than 20 um, but the pitch 804 is equal to about four times the length of the CD 802. In other words, the pad metal density is in this pad array significantly affected (e.g., reduced 65%) by increasing the pad spacing 804 to double the previous case at FIG. 8A.

Figure 8C:
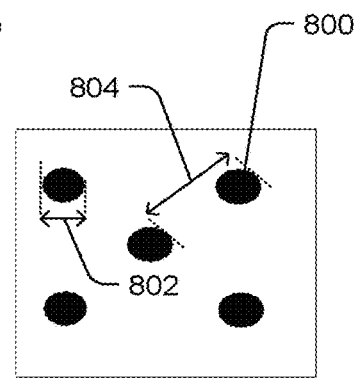

At FIG. 8C, with a conductive pad 800 arrangement as illustrated, the metal density is about 13% with respect to the dielectric. The CD 802 remains about 20 um, however the pitch 804 is equal to about 2.8 times the length of the CD 802. In other words, with the intermediate arrangement of FIG. 8C, the pad metal density in this pad array is still significantly affected (e.g., reduced 35%) by increasing the pad spacing 804 to 1.4 times the spacing of the previous case at FIG. 8A. In some other applications, a width of a pad within an array or pad may vary from 2 to 50 microns and the pitch of the pads within the said array may vary between 1.2 to 8. Also, arrays of pads with different pad configuration may be isolated from each other in periodic or non-periodic patterns or be aggregated to form aggregated arrays of pads. For instance, an aggregated array of pads may comprise a first array of pad comprising of pads with a first pitch, and a second array of pads with a second pitch, and a third array of pads comprising pads with a third pitch. The pitch of the first array of pads may be smaller than the pitch of the second array of pads. In one embodiment, a size of a pad in the first array of pads is larger than the size of a pad in the second array of pads in the aggregated array. In various implementations, with varying metal density on the surface of the die or wafer, the methods of this invention are less sensitive to local or distal variations in pad densities or pad sizes within a die and across the surface of the substrate. The polishing methods may be applied to substrates containing metal pads and trenches with varying metal pattern densities, varying widths (within reasonable limits) and varying depths to produce a planar dielectric surface with minimal dielectric erosion and appropriate recess within the various conductive structures. In one embodiment, the various pads and trenches comprise mechanical pads and trenches configured to enhance properties of the substrate other than electrical, for example to improve the heat transfer capability of the dielectric layer or to provide microelectromechanical systems (MEMS) and the like.

Figure 8D:
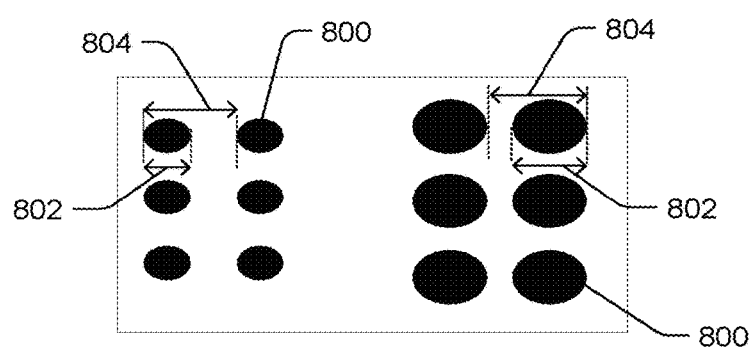

At FIG. 8D, an example arrangement of conductive pads 800 as illustrated. In this example, two arrangements of pads 880 each have different pad sizes and different pitches. Moreover, the arrangements may be separated by a distance that is greater than either of the pitches of the two arrangements. Of course, these are example arrangements and layouts only. In at least one other example, the arrangement of larger pads may have a larger pitch than the arrangement smaller pads. Additionally, other arrangements and/or, non-uniformly arranged contacts may be provided and/or added to these arrangements.

In an implementation, pad 800 arrangements or layouts (e.g., patterns, groupings, etc.) can also be used to minimize dielectric erosion and conductive structure recessing. In traditional common arrangements using conventional CMP methods, pads 800 may be formed and arranged on a die or wafer surface using a regular pattern (same feature size, and generally uniform arrangement) that spans an entire wafer 902 as a method to control dielectric erosion and dishing. Traditional metal CMP methods tend to produce recesses which increase with increasing width of the polished conductive structures. For example, after the barrier removal step, a recess of about 15 nm may be measured in 5-micron wide conductive structures and a recess of about 28 nm measured in 15-micron conductive structures. Similarly, conductive structures larger than 20 microns may exhibit recesses larger than 35 nm. These large variations in the recesses across a conventional die implies that the conductive metals in the smaller conductive structure will have to expand by at least 15 nm, while the larger conductive structure will have to expand by at least 35 nm to mate intimately with the opposing bonding surface. The implication for these large variations in recess across the die is that a higher temperature thermal treatment process for example 320° C. will be needed to effect adequate mechanical and electrical coupling in the various contacting conductive structures and good substrate bonding. In contrast, according to novel structures and methods described herein, pads 800 may be formed and arranged on a die or wafer surface using various pad layouts, arrangements, or patterns, which may be regular, irregular, cyclic, quasi-random, or the like. After the barrier polishing step the variation in the contact structures in these arrangements may be less than 10 nm and preferably less than 6 nm. The immediate practical implication is that intimate good bonding can be formed at lower temperatures typically below 250° C. and preferably below 200° C.

Figure 9:
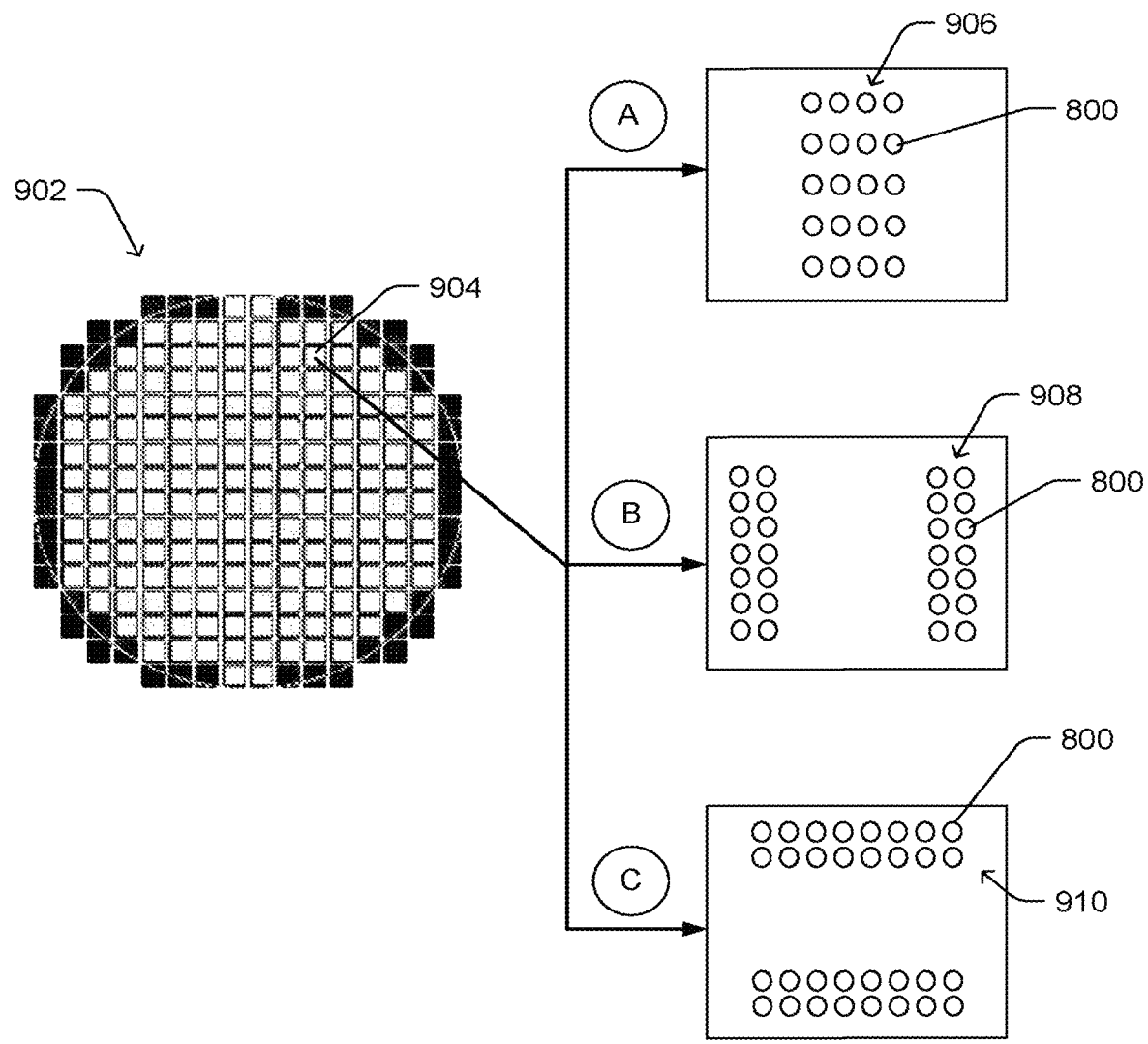
FIG. 9 shows pad layouts based on patterns, according to an embodiment.

For example, FIG. 9 shows some example pad layouts based on example patterns, according to various embodiments. Arrangements 906, 908, and 910 show examples of a flexibility in design for the patterns used across the die or wafer enabled by the presently disclosed techniques. Such variation of pad size and layout within a single design is attractive to circuit designers as it reduces or eliminates the need for dummy pads, which would otherwise be required to achieve necessary planarity. This variance from a uniform layout is desirable because, unconnected metal (e.g. dummy pads) is undesirable above signal lines due to the potential coupling loss. The present techniques allow designers more flexibility in layout to avoid this undesirable situation.

Other advantages of the techniques described herein include reduced metal layers and reduced cost associated with stacking. For example, combining a TSV structure with the ability to control the planarity and dielectric erosion for a quality bond surface, allows the stacking of wafers or die TSV to TSV, TSV to pad, and/or pad to pad connections across the bonding interface. As such, the interconnect on the front side of a second circuit die or wafer is achievable without the need for a metal layer deposition on top of the TSV. This may result in a simplification of processing for complex stacked structures such as memory arrays. To control dishing across all pads 800, a first pattern may be used for one or more specific regions of the surface of the die or wafer, with other patterns used for one or more other regions, as desired.

A as shown through FIG. 9, a grouping of pads 800 may have any of a variety of arrangements, including, but not limited to those shown. At A, a first example pattern 906 is illustrated. At B, a second example pattern 908 is shown, with a different arrangement or grouping. At C, a third example pattern 910 is shown with an alternate arrangement. It is to be appreciated that any type of pattern or arrangement of the pads 800 of the example wafer 902 may be used without deleterious dielectric erosion and conductive structure recessing. These and other patterns may be used separately or combined within in single die or design to any layout of pads 800, where one pattern or arrangement may be followed by a different pattern or arrangement in subsequent groupings of pads 800. Such pattern arrangements permit adaptation of design for memory, logic, or other electrical active or passive components and systems.

In one embodiment, dishing of conductive structures 608 may occur across some or all pads 800, at different severities based on the size of the pads 800, or based on the pitch or arrangement of the pads 800 where the feature size is consistent among all pads 800. Accordingly, in various embodiments, while maintaining other process elements equal, control of dielectric erosion and conductive structure recessing, including reducing or minimizing dielectric erosion and conductive structure recessing is accomplished by adjusting pad (800) size, pitch, and/or arrangement (groupings, patterns, etc.).

Figure 10A:
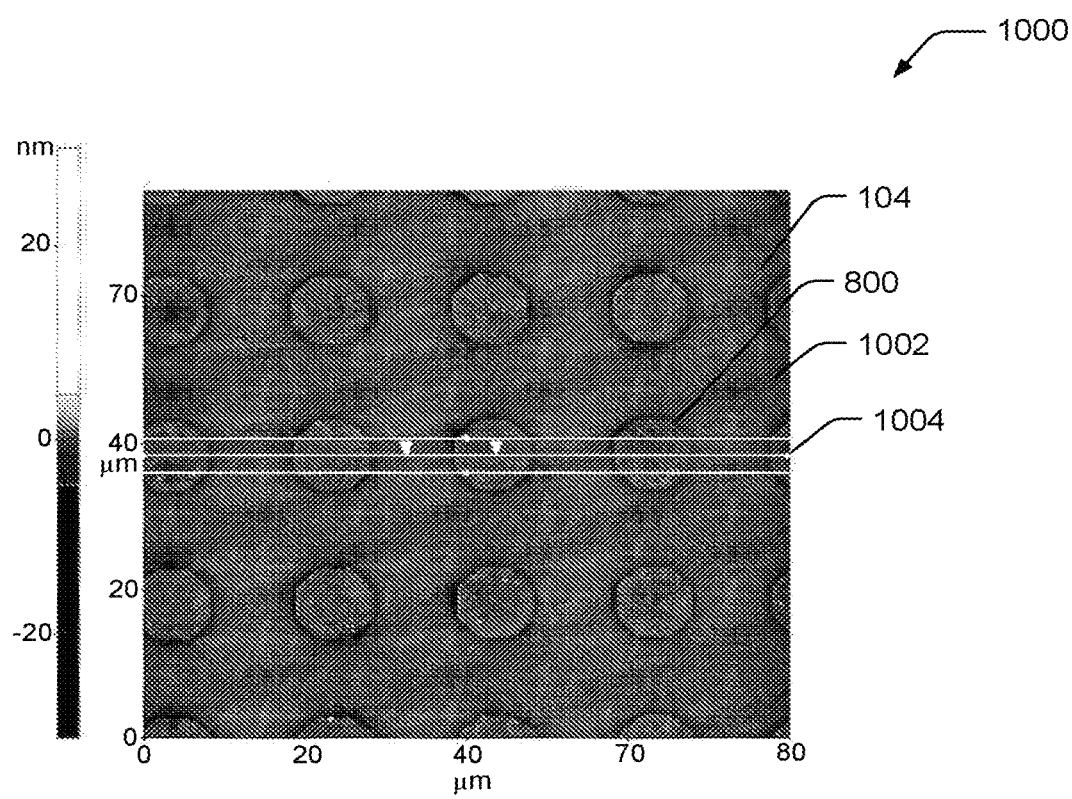
FIGS. 10A and 10B show results of pad conditioning parameters, according to an embodiment.
Figure 10B:
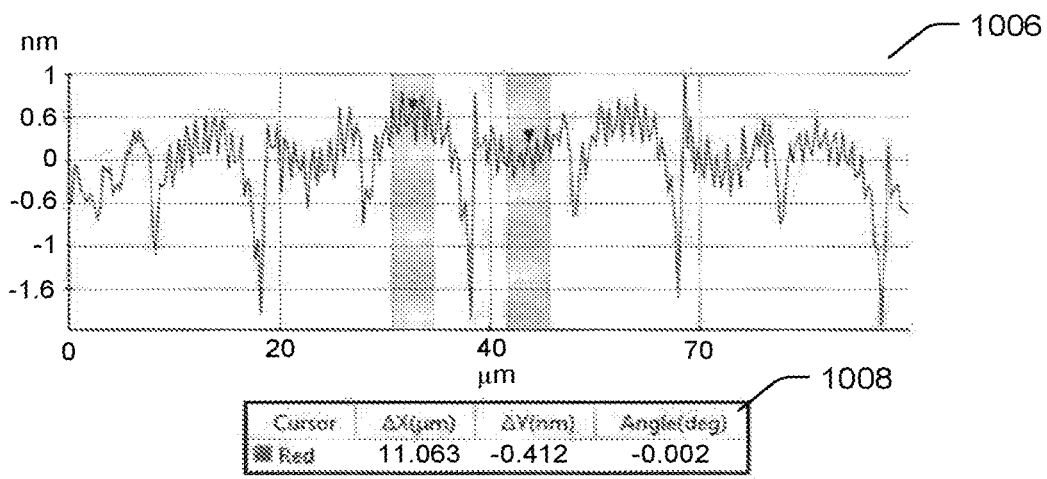

FIGS. 10A and 10B show example surface planarizing results 1000, based on pad conditioning parameters, according to an embodiment. Pad conditioning parameters may affect polish rates and, in turn, affect final dielectric erosion (such as the rounding of the dielectric layer) and conductive structure dishing. For example, when using a DOW IC1000™ type pad with no intentional conditioning, the polish rates of the conductive material of the conductive structure, the barrier metal, and the dielectric layer may be maintained over a plurality of wafers without using intentional conditioning of the pad with a conditioning disc. This process may be used over a variety of DBI patterns including 10 um diameter DBI pads on a 20 um pitch, as well as seal ring wafers with 5-15 um wide seal ring copper lines. In one embodiment, polishing patterned metal barrier wafers may assist with naturally conditioning the pad. Additionally, a regular polish of the DBI wafer barrier layers may keep the DOW IC1000™ pad conditions in an ideal state for DBI dishing.

As shown with the results 1000, low conductive structure dishing may be demonstrated with a 10 um diameter pad 800 with a 20 um pitch. As described hereinabove, in some instances, a pitch of a plurality of interconnect pads 800, for example, comprising a conductive structure (such as the conductive structure 608, for example) may be two times a width of the conductive pad 800. Additionally, the conductive structure may include a pad 800, a trench, a trace, and/or a through substrate interconnect.

As an example, wafer 1002 may include a plurality of pads 800 of diameter 10 um with a 20 um pitch. Sample line 1004 represents a cross section of the wafer 1002 after the barrier layer removal process, used to evaluate a dishing of the pads 800 and a rounding of the dielectric 104. For example, a profile line 1006 shows the profile of the pads 800 and the dielectric 104 at the cross-section sample line 1004. Additionally, the table 1008 shows the instantaneous change of profile elevation at the location of the cursors along the sample line 1004.

Example Polishing Formula and Parameters

In various embodiments, a variety of recipes may be used consistent with the disclosure given herein. For example, a first recipe for achieving acceptable DBI bonding surfaces may include using a reduced slurry of the following constraints: 1) Tool IPEC 472 with ViPR carrier; 2) Table speed 63; 3) Wafer carrier speed 57; 4) Pad Suba™ 500 EMB embossed pad; 5) Intentional pad conditioning-none; 6) Downward force 1.5; 7) Slurry flow 40 ml/min; and 8) Dow ACuPLANE™ LK393 slurry mix with about 13 ml of H2O2 added to each liter of slurry. In this manner, the low slurry flow of 40 ml/min combined with the low downward force and the Suba™ pad may assist in achieving a steady state conductive structure dishing value for DBI of 5 um and below 1-10 nm (of a final step of CMP).

A second recipe for achieving acceptable DBI bonding surfaces may include using a diluted slurry flow of the following constraints: 1) Tool AMAT Mirra® MESA with contour head; 2) Table speed 113; 3) Wafer carrier speed 107; 4) Pad Suba™ 500 GEL XY grooved pad; 5) Intentional pad conditioning-none; 6) Downward force 2 psi; 7) Slurry flow 150 ml/min; and 8) Dow ACuPLANE™ LK393 1 liter, to 2.75 liters water, to 15 ml of H2O2. In one embodiment, this diluted slurry flow may work well for 5-10 urn diameter wafers, where such wafers have protruding copper and low initial conductive structure dishing after the normal barrier polish at normal slurry flows. In this manner, the diluted slurry combined with the higher table and carrier speed and the XY cut pad may assist in achieving a constant conductive structure dishing of about 2-3 nm (second predetermined recess). Additionally, using this recipe, longer polish times may lead to increased dielectric erosion (such as corner rounding of the dielectric layer) adjacent to the copper pad.

A third recipe for achieving acceptable DBI surfaces may include using reduced H2O2 of the following constraints: 1) Tool IPEC 472 with Titan carrier; 2) Table speed 63; 3) Wafer carrier speed 57; 4) Pad Suba™ 500 EMB embossed pad; 5) Pad conditioning, in situ 5 sweeps per minute, 6 psi, 3M conditioning disc; 6) Downward force 1.5; 7) Slurry flow 40 ml/min; and 8) Dow ACuPLANE™ LK393 5 liters, H2O2 13 ml. In this manner, the reduced H2O2 may assist in recovering conductive material (such as copper) that may have been previously dished following a polishing (using CMP) of the conductive structure.

A fourth recipe for achieving acceptable DBI surfaces may include conditioning of the following constraints: 1) Tool Strasbaugh 6EC with VipR carrier; 2) Table speed 63; 3) Wafer carrier speed 57; 4) IC 1000; 5) Pad conditioning-no intentional conditioning; 6) Downward force 3; 7) Slurry flow 150 ml/min; and 8) Dow ACuPLANE™ LK393 slurry mix 13 ml H2O2 per liter. In this manner, the conditioning may assist in achieving consistent planarization over a variety of metal shapes and sizes.

Figure 11:
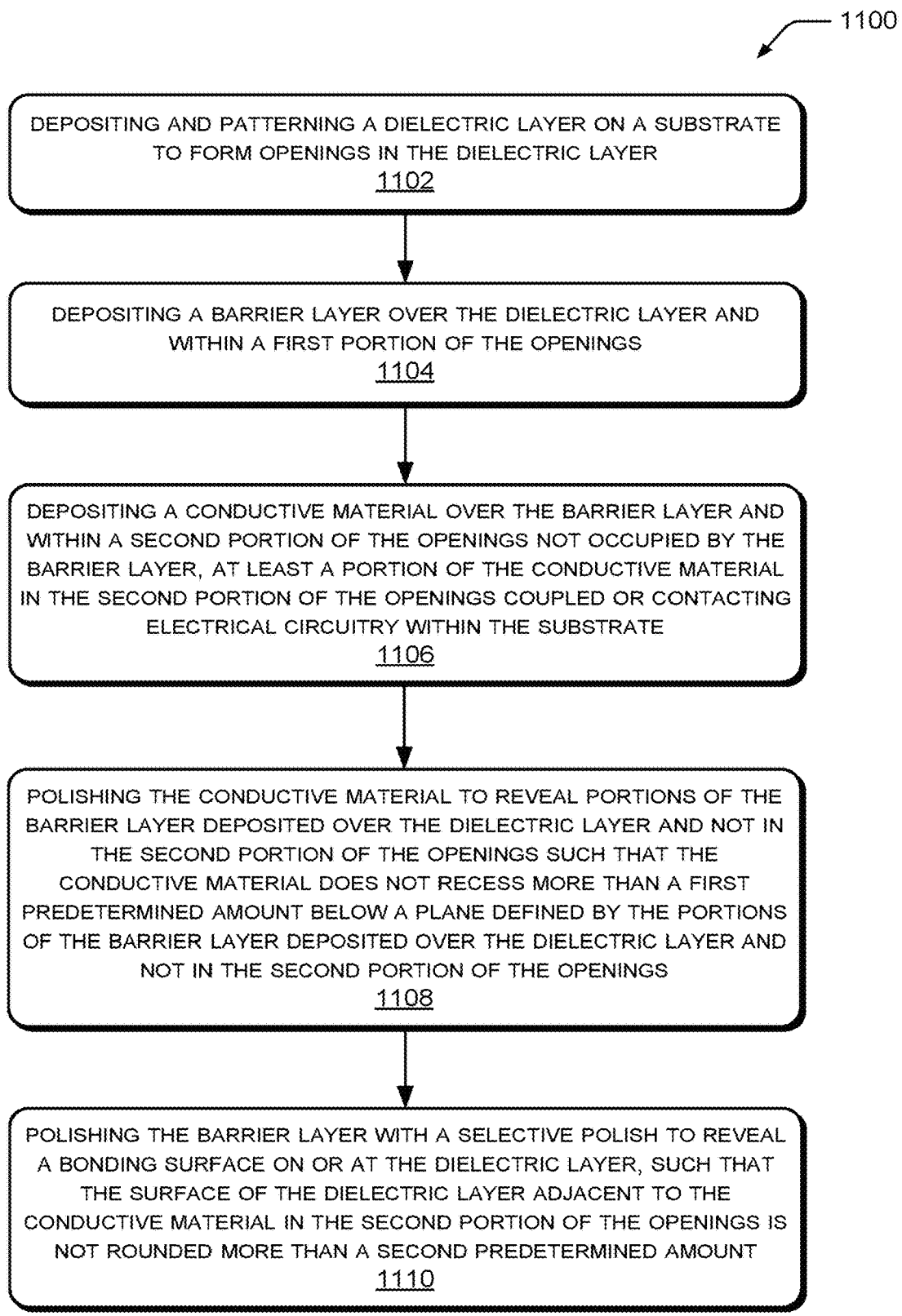
FIG. 11 is a flow diagram illustrating example processes for polishing layers for hybrid bonding, according to an embodiment.

FIG. 11 is a flow diagram 1100 illustrating example processes for polishing layers for hybrid bonding, according to various embodiments. At 1102, the process includes depositing and patterning a dielectric layer (such as the dielectric layer 604) on a substrate (such as the substrate layer 602) to form openings (such as the opening 610, for example) in the dielectric layer. Additionally, at 1104, the process includes depositing a barrier layer (such as the barrier layer 606, for example) over the dielectric layer and within a first portion of the openings. At 1106, the process includes depositing a conductive structure (such as the conductive structure 608) over the barrier layer and within a second portion of the openings not occupied by the barrier layer, at least a portion of the conductive structure in the second portion of the openings coupled to or contacting electrical circuitry or one or more conductive structures. The method of depositing conductive structures may include depositing a seed layer over the barrier layer prior to the deposition of the conductive structure. In one embodiment, at least a portion of the conductive structure in the openings may be coupled to or may contact electrical circuitry within the substrate. Additionally, the process may include preparing a first planar bonding surface for bonding operation and bonding the first planar bonding surface with a second planar bonding surface. For example, an electrical connection may be formed between a conductive structure (such as the conductive structure 608) and that of another conductive structure after bonding by annealing the bonded structure at a temperature under 400 degrees C. In one embodiment, the bonded structure may be annealed at a temperature below 350 degrees C.

Further, any number of wafers may be prepared by the process disclosed herein, and then stacked. For example, a first and second wafer (such as the first wafer 102 and/or the second wafer 306, for example) may be prepped and found planar, and may be stacked accordingly (e.g. the bonding surface of the first wafer 102 may be bonded to the bonding surface of the second wafer 306). Any number of additional wafers may be stacked on top of or below (and bonded to) the stacked first and second wafers (such as the first wafer 102 and/or the second wafer 306, for example). In one embodiment, a bonding surface preparation step may include cleaning the bonding surface of both a first and second wafer and exposing the cleaned surface of the first and/or second wafer to a nitrogen or halide plasma. Moreover, a second surface (i.e. an unbonded surface) of a bonded wafer (such as of the first dielectric layer 502 and/or the second dielectric layer 506) may be planarized in preparation for subsequent bonding.

Additionally, the bonding surface of the substrate and the bonding surface of another substrate may be bonded using a direct bonding technique without adhesive, using a metal to metal diffusion bond, or both (e.g., a hybrid bond). Further, the bonding surface and the conductive structure may have a combined surface roughness of less than 1 nm root mean square (RMS).

In one embodiment, a CTE of any two adjacent bonded wafers (such as between the first wafer 102 and the second wafer 306) may be dissimilar. For example, the CTE of a material of a first dielectric layer may be two (2) times higher than the CTE of a material of a second dielectric layer. Additionally, the width of the dielectric layers may be dissimilar. For example, in one embodiment, the second wafer 306 may include segmented substrates or dies where a bonding surface has been formed, and the prepared bonding surface may be intimately bonded to a prepared surface of another wafer (such as the first wafer 102). Additionally, the back surface of the bonded dies may be planarized such that a planarized back surface may be cleaned and prepared for subsequent additional bonding. In this manner, multiple die stacks may be formed.

At 1108, the process includes polishing the conductive structure to reveal portions of the barrier layer deposited over the dielectric layer and not in the second portion of the openings such that the conductive structure does not recess (or dish) more than 10 nm below a plane defined by the portions of the barrier layer deposited over the dielectric layer and not in the second portion of the openings.

At 1110, the process includes polishing the barrier layer with a selective polish to reveal a bonding surface on or at the dielectric layer without rounding the surface of the dielectric adjacent to the conductive structure in a second portion of the openings.

It is to be appreciated that the flow diagram 1100 may operate in the context of any of the foregoing figures. For example, polishing the conductive structure in a manner to reduce conductive structure dishing, and/or polishing the barrier layer in a manner to reduce dielectric erosion may use one or more of the processes of FIG. 7 (such as to achieve a steady state by modifying the rate of the polishing of the dielectric layer 702 and the conductive structure 706), pad layouts of FIG. 8 (which may take into account the metal density, the CD of the pad, and the pitch between the pads), and the pad layouts of FIG. 9 (which may take into the patterns of the pad layouts). In this manner, the method of FIG. 11 may be applied in the context of any of the foregoing figures.

As disclosed herein, polishing the conductive structure may include maintaining a uniform conductive structure removal rate. Additionally, polishing the conductive structure may be controlled by a reactive liquid slurry. Polishing the barrier layer may include removing any excess barrier layer, and may include simultaneously removing at least a portion of the conductive material, at least a portion of the barrier layer, and at least a portion of the dielectric layer. Further, a rate of removal associated with the polishing the barrier layer may control a depth of the conductive structure and a degree of a slope of the dielectric layer.

A selectivity associated with the polishing the barrier layer may control a depth of the conductive structure and a degree of a slope of the dielectric layer. For example, the selectivity may be a ratio of the removal rate of two different material. The selectivity of the conductive structure to the dielectric layer may be a ratio of a removal rate of the conductive structure (such as copper) divided by a removal rate of dielectric layer (such as oxide).

The selectivity may also include modifying metal layer parameters including at least one of a barrier metal type, a barrier metal thickness, or an erosion rate of a barrier metal. For example, the barrier metal types may include at least one of titanium in use with a Cabot EPOCH C8902 copper slurry, or titanium or tantalum in use with a Dow ACuPLANE™ LK393 slurry. The selectivity may include modifying polishing consumables including at least one of a polishing pad, a slurry type, slurry flow rate, slurry dilution, polishing pressures, or a conditioning disc type. The polishing pad may include one of Suba™ 500 or DOW IC1000™ type pads. Additionally, the selectivity may include modifying polishing parameters including at least one of a platen speed, a wafer carrier speed, a slurry flow, a downward force, or a pad conditioning type. For example, increasing the slurry flow may decrease a dishing of the conductive material, or decreasing the slurry flow may increase the dishing of the conductive material.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A component comprising:
a first substrate comprising at least a first dielectric layer, a first plurality of first conductive structures at least partially embedded in the first dielectric layer, and a second plurality of second conductive structures at least partially embedded in the first dielectric layer, wherein at least one of the first conductive structures in the first plurality of first conductive structures has a first profile along a first bonding surface of the first substrate, wherein at least one of the second conductive structures in the second plurality of second conductive structures has a second profile along the first bonding surface, the second profile being different from the first profile, the first and second pluralities being on a same side of the first substrate; and
a second substrate directly hybrid bonded to the first substrate, the second substrate comprising at least a second dielectric layer directly bonded to the first dielectric layer, a third plurality of third conductive structures at least partially embedded in the second dielectric layer, and a fourth plurality of fourth conductive structures at least partially embedded in the second dielectric layer, the third and fourth pluralities being on a same side of the second substrate, at least one of the third conductive structures on the second substrate directly bonded to at least one of the first conductive structures on the first substrate and at least one of the fourth conductive structures on the second substrate directly bonded to at least one of the second conductive structures on the first substrate,
wherein the at least one of the third conductive structures comprises a first copper structure, wherein the at least one of the first conductive structures comprises a second copper structure, and wherein the first and second copper structures are in direct physical contact along a bonding interface,
wherein the at least one of the fourth conductive structures comprises a third copper structure, wherein the at least one of the second conductive structures comprises a fourth copper structure, and wherein the third and fourth copper structures are in direct physical contact along the bonding interface.

2. The component of claim 1, wherein a pitch of the first plurality of first conductive structures is different from a pitch of the second plurality of second conductive structures.

3. The component of claim 1, wherein the first and second profiles comprise different shapes.

4. The component of claim 1, wherein each first conductive structure of the first plurality of first conductive structures has a width of at least 5 microns.

5. The component of claim 1, wherein a pitch of the first plurality of first conductive structures is at least 1.2 times a width of at least one of the first conductive structures.

6. The component of claim 1, wherein the first plurality of first conductive structures is separated from the second plurality of second conductive structures by a distance that is greater than either the pitch of the first plurality or the pitch of the second plurality.

7. The component of claim 1, wherein the first and second pluralities of first and second conductive structures each have a uniform pitch.

8. The component of claim 1, wherein the first profile comprises a first width and the second profile comprises a second width greater than the first width.

9. The component of claim 1, wherein a first spacing between adjacent first conductive structures is less than a second spacing between adjacent second conductive structures.

10. The component of claim 1, wherein a shape of the first plurality of first conductive structures is circular.

11. The component of claim 1, wherein widths of the first conductive structures in the first plurality are uniform.

12. The component of claim 1, wherein a pitch of the first conductive structures in the first plurality is uniform.

13. The component of claim 1, wherein widths of the first conductive structures are uniform and widths of the second conductive structures are uniform.

14. The component of claim 1, wherein the first substrate comprises an optical device.

15. The component of claim 1, wherein the first plurality of first conductive structures has a first pitch and the second plurality of second conductive structures has a second pitch that is different than the first pitch and wherein the first profile comprises a first width and the second profile comprises a second width greater than the first width.

16. A component comprising:
a first substrate comprising at least a first dielectric layer, a first plurality of first conductive structures at least partially embedded in the first dielectric layer and having a first pitch, and a second plurality of second conductive structures at least partially embedded in the first dielectric layer and having a second pitch different from the first pitch, the first and second pluralities being on a same side of the first substrate, the first dielectric layer at a bonding interface comprising a deposited layer including nitrogen; and
a second substrate directly hybrid bonded to the first substrate, the second substrate comprising at least a second dielectric layer directly bonded to the first dielectric layer at the bonding interface, a third plurality of third conductive structures at least partially embedded in the second dielectric layer and a fourth plurality of fourth conductive structures at least partially embedded in the second dielectric layer, the third and fourth pluralities being on a same side of the second substrate, at least one of the third conductive structures on the second substrate directly bonded to at least one of the first conductive structures on the first substrate and at least one of the fourth conductive structures on the second substrate directly bonded to at least one of the second conductive structures on the first substrate.

17. The component of claim 16, wherein at least one of the first conductive structures in the first plurality has a width that is different than a width of at least one of the second conductive structures in the second plurality.

18. The component of claim 16, wherein a pitch of the first plurality of first conductive structures is at least 1.2 times a width of at least one of the first conductive structures.

19. The component of claim 16, wherein the first substrate further comprises a first region with no conductive structures on the same side of the first substrate as the first and second pluralities along the bonding interface between the first and second substrates.

20. The component of claim 19, wherein the first region is in a central region along the bonding interface between the first and second substrates, and wherein the central region comprises less than half of the area of the bonding interface.

21. The component of claim 16, wherein the first plurality is separated from the second plurality by a distance that is greater than either the first pitch of the first plurality or the second pitch of the second plurality, and wherein a region separating the first plurality from the second plurality is free of conductive structures.

22. The component of claim 16, wherein widths of the first conductive structures in the first plurality are uniform.

23. The component of claim 16, wherein a pitch of the first conductive structures in the first plurality is uniform.

24. The component of claim 16, wherein the first dielectric layer comprises silicon nitride.

25. The component of claim 16, wherein the second dielectric layer comprises a deposited layer including nitrogen.

26. The component of claim 25, wherein the second dielectric layer comprises silicon nitride.

* * * * *